United States Patent
Yoshimoto et al.

(10) Patent No.: US 12,129,546 B2
(45) Date of Patent: Oct. 29, 2024

(54) METHODS AND APPARATUSES FOR FLOWABLE GAP-FILL

(71) Applicant: ASM IP HOLDING B.V., Almere (NL)

(72) Inventors: Shinya Yoshimoto, Tama (JP); Takahiro Onuma, Chofu (JP); Makoto Igarashi, Fuchu (JP); Yukihiro Mori, Machida (JP); Hideaki Fukuda, Hachioji (JP); Rene Henricus Jozef Vervuurt, Heverlee (BE); Timothee Blanquart, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 71 days.

(21) Appl. No.: 17/451,299

(22) Filed: Oct. 18, 2021

(65) Prior Publication Data

US 2022/0119944 A1    Apr. 21, 2022

Related U.S. Application Data

(60) Provisional application No. 63/094,768, filed on Oct. 21, 2020.

(51) Int. Cl.
C23C 16/455    (2006.01)
C23C 16/46     (2006.01)
C23C 16/52     (2006.01)

(52) U.S. Cl.
CPC .. *C23C 16/45527* (2013.01); *C23C 16/45544* (2013.01); *C23C 16/45553* (2013.01); *C23C 16/46* (2013.01); *C23C 16/52* (2013.01)

(58) Field of Classification Search
CPC ........ C23C 16/45527; C23C 16/45544; C23C 16/45553; C23C 16/46; C23C 16/52
See application file for complete search history.

(56) References Cited

U.S. PATENT DOCUMENTS

| | | | |
|---|---|---|---|
| 3,675,563 A | 7/1972 | Metreaud | |
| 4,764,076 A | 8/1988 | Layman et al. | |
| 5,292,393 A | 3/1994 | Maydan et al. | |

(Continued)

FOREIGN PATENT DOCUMENTS

| | | |
|---|---|---|
| EP | 0 699 777 | 3/1996 |
| JP | H03-274746 | 12/1991 |

(Continued)

OTHER PUBLICATIONS

Bien et. al., "Multiple Self-Aligned Iron Nanowires by a dual selective chemical vapor deposition process", Electrochemical and Solid-state Letters, vol. 10, H251-H253 (2007).

(Continued)

*Primary Examiner* — Michael G Miller
(74) *Attorney, Agent, or Firm* — Snell & Wilmer L.L.P.

(57) ABSTRACT

In accordance with some embodiments herein, methods and apparatuses for flowable deposition of thin films are described. Some embodiments herein relate to cyclical processes for gap-fill in which deposition is followed by a thermal anneal and repeated. In some embodiments, the deposition and thermal anneal are carried out in separate station. In some embodiments second module is heated to a higher temperature than the first station. In some embodiments, the thermal anneal comprises RTA.

20 Claims, 13 Drawing Sheets

(56) References Cited

U.S. PATENT DOCUMENTS

| | | |
|---|---|---|
| 5,379,984 A | 1/1995 | Coad et al. |
| 5,380,094 A | 1/1995 | Schmidt et al. |
| 5,460,478 A | 10/1995 | Akimoto et al. |
| 5,494,494 A | 2/1996 | Mizuno et al. |
| 5,514,260 A | 5/1996 | Seo |
| 5,525,160 A | 6/1996 | Tanaka et al. |
| 5,538,610 A | 7/1996 | Gesche et al. |
| 5,554,249 A | 9/1996 | Hasegawa et al. |
| 5,611,655 A | 3/1997 | Fukasawa et al. |
| 5,611,886 A | 3/1997 | Bachman et al. |
| 5,616,208 A | 4/1997 | Lee |
| 5,639,309 A | 6/1997 | Akimoto |
| 5,667,592 A | 9/1997 | Boitnott et al. |
| 5,755,888 A | 5/1998 | Torii et al. |
| 5,855,681 A | 1/1999 | Maydan et al. |
| 5,900,105 A | 5/1999 | Toshima |
| 6,077,157 A | 6/2000 | Fairbairn et al. |
| 6,086,680 A | 7/2000 | Foster et al. |
| 6,139,692 A | 10/2000 | Washburn et al. |
| 6,139,695 A | 10/2000 | Washburn et al. |
| 6,143,082 A | 11/2000 | McInerney et al. |
| 6,152,070 A | 11/2000 | Fairbairn et al. |
| 6,231,716 B1 | 5/2001 | White et al. |
| 6,446,646 B1 | 9/2002 | Izumi |
| 6,902,620 B1 | 6/2005 | Omstead et al. |
| 7,438,760 B2 | 10/2008 | Bauer et al. |
| 7,666,773 B2 | 2/2010 | Huotari et al. |
| 7,763,115 B2 | 7/2010 | Hatanaka et al. |
| 8,041,450 B2 | 10/2011 | Takizawa et al. |
| 8,043,432 B2 | 10/2011 | Dip |
| 8,347,813 B2 | 1/2013 | Kim et al. |
| 8,691,669 B2 | 4/2014 | Lee |
| 8,841,182 B1 | 9/2014 | Chen et al. |
| 8,846,550 B1 | 9/2014 | Shero et al. |
| 8,940,646 B1 | 1/2015 | Chandrasekharan et al. |
| 8,956,971 B2 | 2/2015 | Haukka et al. |
| 9,153,433 B2 | 10/2015 | Kato et al. |
| 9,960,072 B2 | 5/2018 | Coomer |
| 10,190,214 B2 | 1/2019 | Shon et al. |
| 10,204,790 B2 | 2/2019 | Kawahara et al. |
| 10,312,129 B2 | 6/2019 | Coomer |
| 10,329,669 B2 | 6/2019 | Cho |
| 10,332,767 B2 | 6/2019 | Omori |
| 10,358,721 B2 | 7/2019 | Kim et al. |
| 10,364,493 B2 | 7/2019 | Lee et al. |
| 10,403,523 B2 | 9/2019 | Kim et al. |
| 10,480,073 B2 | 11/2019 | Murakawa |
| 10,662,525 B2 | 5/2020 | Jang et al. |
| 10,738,381 B2 | 8/2020 | Jang et al. |
| 10,777,445 B2 | 9/2020 | Nishiwaki |
| 10,822,695 B2 | 11/2020 | Jang et al. |
| 10,867,786 B2 | 12/2020 | Choi |
| 10,876,218 B2 | 12/2020 | Yoo et al. |
| 2001/0011526 A1 | 8/2001 | Doering et al. |
| 2002/0100418 A1 | 8/2002 | Sandhu et al. |
| 2002/0108570 A1 | 8/2002 | Lindfors |
| 2003/0072975 A1 | 4/2003 | Shero et al. |
| 2004/0058293 A1 | 3/2004 | Nguyen |
| 2004/0131766 A1 | 7/2004 | Katsuoka |
| 2004/0149211 A1 | 8/2004 | Ahn et al. |
| 2004/0221808 A1 | 11/2004 | Kawano |
| 2005/0000937 A1 | 1/2005 | Chiang et al. |
| 2005/0034664 A1 | 2/2005 | Koh |
| 2005/0092247 A1 | 5/2005 | Schmidt et al. |
| 2005/0280050 A1 | 12/2005 | Doczy et al. |
| 2006/0009034 A1 | 1/2006 | Lai et al. |
| 2007/0026654 A1 | 2/2007 | Huotari et al. |
| 2007/0034479 A1 | 2/2007 | Todaka |
| 2008/0075858 A1 | 3/2008 | Koh |
| 2008/0193643 A1 | 8/2008 | Dip |
| 2008/0200019 A9 | 8/2008 | Huotari et al. |
| 2008/0226842 A1 | 9/2008 | Vukovic |
| 2008/0241384 A1 | 10/2008 | Jeong |
| 2008/0241387 A1 | 10/2008 | Keto |
| 2009/0104351 A1 | 4/2009 | Kakegawa |
| 2010/0010491 A1 | 1/2010 | Alda |
| 2010/0071730 A1 | 3/2010 | Ravkin et al. |
| 2010/0101491 A1 | 4/2010 | Aida |
| 2010/0102417 A1 | 4/2010 | Ganguli et al. |
| 2010/0107978 A1 | 5/2010 | Todd et al. |
| 2011/0263115 A1 | 10/2011 | Ganguli et al. |
| 2011/0298062 A1 | 12/2011 | Ganguli et al. |
| 2012/0322250 A1 | 12/2012 | Ganguli et al. |
| 2013/0189837 A1 | 7/2013 | Haukka et al. |
| 2013/0196078 A1 | 8/2013 | Yudovsky |
| 2013/0210238 A1 | 8/2013 | Yudovsky |
| 2013/0269609 A1 | 10/2013 | Leeser |
| 2014/0105709 A1 | 4/2014 | Abarra et al. |
| 2014/0127405 A1 | 5/2014 | Li et al. |
| 2015/0118862 A1* | 4/2015 | Reilly ............... H01L 21/02164 438/778 |
| 2015/0217330 A1 | 8/2015 | Haukka et al. |
| 2015/0225848 A1 | 8/2015 | Han et al. |
| 2015/0299848 A1 | 10/2015 | Haukka et al. |
| 2015/0368798 A1 | 12/2015 | Kwong |
| 2015/0376786 A1 | 12/2015 | Yudovsky et al. |
| 2017/0029947 A1 | 2/2017 | Kawahara et al. |
| 2017/0029948 A1 | 2/2017 | Jongbloed et al. |
| 2017/0032956 A1 | 2/2017 | Kawahara et al. |
| 2018/0187304 A1 | 7/2018 | Liu |
| 2019/0311940 A1 | 10/2019 | Choi et al. |
| 2019/0346300 A1 | 11/2019 | Kim et al. |
| 2019/0390343 A1 | 12/2019 | Min et al. |
| 2020/0071828 A1 | 3/2020 | Jongbloed et al. |
| 2020/0224308 A1 | 7/2020 | Jang et al. |
| 2020/0286719 A1 | 9/2020 | Nishiwaki |
| 2020/0381275 A1* | 12/2020 | Brezoczky ........ H01L 21/67161 |
| 2021/0054519 A1 | 2/2021 | Yoo et al. |
| 2021/0166910 A1 | 6/2021 | Kim et al. |
| 2021/0180188 A1 | 6/2021 | Kim et al. |
| 2021/0257509 A1 | 8/2021 | Nishiwaki |
| 2021/0319982 A1 | 10/2021 | Kim et al. |
| 2021/0398826 A1 | 12/2021 | Mori |
| 2022/0044956 A1 | 2/2022 | Choi et al. |
| 2022/0119944 A1 | 4/2022 | Yoshimoto et al. |

FOREIGN PATENT DOCUMENTS

| | | |
|---|---|---|
| JP | H07-321178 | 12/1995 |
| JP | 2014-082419 | 5/2014 |
| JP | 2014-201804 | 10/2014 |
| KR | 2009-0034723 | 4/2009 |
| KR | 2016-0139504 | 12/2016 |
| WO | WO 1995/04168 | 2/1995 |
| WO | WO 2014/030973 | 2/2014 |
| WO | WO 2014/127363 | 8/2014 |
| WO | WO 2014/130670 | 8/2014 |

OTHER PUBLICATIONS

File History of U.S. Appl. No. 14/811,370, filed Jul. 28, 2015.
File History of U.S. Appl. No. 14/811,435, filed Jul. 28, 2015.
File History of U.S. Appl. No. 14/811,528, filed Jul. 28, 2015.
File History of U.S. Appl. No. 16/677,446, filed Nov. 7, 2019.
International Search Report and Written Opinion dated Sep. 26, 2016 in Application No. PCT/US2016/040349.
International Search Report and Written Opinion dated Sep. 16, 2016 in Application No. PCT/US2016/040350.
Office Action dated Jan. 20, 2020 in corresponding Taiwanese Patent Application No. 105122151 in 9 pages.
Office Action dated May 20, 2020 in corresponding Taiwanese Patent Application No. 105122151 in 12 pages.
Office Action dated Oct. 15, 2019 in corresponding Taiwanese Patent Application No. 105122325 in 11 pages.
Puurunen et al., "Successive reactions of gaseous trimethylaluminium and ammonia on porous alumina", Phys. Chem. Chem. Phys., 2001, vol. 3, pp. 1093-1102.

(56) References Cited

OTHER PUBLICATIONS

Tischler et al., "Growth and Characterization of Compound Semiconductors by Atomic Layer Epitaxy", Journal of Crystal Growth, vol. 77, pp. 89-94, 1986.

\* cited by examiner (a) ALD/CVD deposition (b) Flowable deposition (c) Flowable deposition & post anneal (d) Flowable deposition & cyclic anneal

METHODS AND APPARATUSES FOR FLOWABLE GAP-FILL

INCORPORATION BY REFERENCE TO ANY PRIORITY APPLICATIONS

The present application claims the benefit under 35 U.S.C. § 119(e) of U.S. Provisional Application No. 63/094,768, filed Oct. 21, 2020, and entitled "METHODS AND APARATUSES FOR FLOWABLE GAP-FILL." The foregoing application is hereby incorporated herein by reference in its entirety under 37 C.F.R. § 1.57. Any and all applications for which a foreign or domestic priority claim is identified in the Application Data Sheet as filed with the present application are hereby incorporated by reference under 37 CFR 1.57.

BACKGROUND

Field

Integrated circuits are typically manufactured by an elaborate process in which various layers of materials are sequentially constructed in a predetermined arrangement on a semiconductor substrate.

Some embodiments herein relate to semiconductor fabrication, and methods and apparatuses for flowable deposition of thin films. In semiconductor fabrication, it is often necessary to fill gaps in a substrate, for example with insulating material. As device geometries shrink, void-free filling of gaps becomes increasingly difficult due to limitations of existing deposition processes. The films typically deposited by existing flowable gap-fill processes have a variety of drawbacks. For example, they may exhibit poor quality and/or bad thermal stability. This may result in a higher than desired wet etch rate and film shrinkage of 40% or more after annealing at increased temperatures (e.g. around 400° C.).

Many deposition processes have difficulty filling small trenches and other gap features used in current semiconductor processing schemes. Individual trenches and other gap type features produced in any given technology node have principal dimensions that are significantly smaller than the critical dimensions that define the node. Thus, it is common to find gaps on a nanometer scale. Furthermore, unless the processes are extremely conformal, the gaps pinch off at their necks forming voids. Furthermore, many of these gaps have relatively high aspect ratios.

Filling gaps with fill material, while avoiding voids in the fill material is challenging. Recent minimization of semiconductor devices, such as Self-Aligned-Contact (SAC) gap-fill in MEOL devices, and dummy fin gap-fill/Gate All Around (GAA) lateral gap-fill in FEOL devices, requires perfectly void-less and seam-less gap fill, with high film quality against etching stability and post-thermal shrinkage. Conventional Chemical Vapor Deposition (CVD) and Atomic Layer Deposition (ALD) of, for example, SiN films inevitably results in seams and/or voids inside the gap structure. It is very difficult to obtain a flowable SiN film during film deposition. For example, FIG. 1A illustrates an example gap-fill using ALD or CVD deposition of a thin film. As illustrated, ALD or CVD deposition on its own may result in the formation of one or more voids in the gap. FIG. 2A illustrates a scanning transmission electron microscopy (STEM) image of an example flowable SiCN film formed using ALD or CVD deposition. The SiCN film gap structure of FIG. 2A exhibits multiple voids.

One way to reduce the formation of seams or voids in SiN or SiCN film deposition in a gap is to use flowable deposition with another element such as a carbon (e.g. methyl group) or hydrogen (e.g. amine group) added in a gap-fill precursor. This method may lead to a flowable SiCN or SiN deposition with substantially no seams/voids. FIGS. 1B and 2B illustrate example void-free gap fills using a flowable deposition with carbon or hydrogen augmented precursors. However, flowable deposition processes are often performed at low temperature (e.g. 150° C. or less) to maintain precursor flowability, resulting in a lower film quality. The films typically deposited by flowable gap-fill exhibited poor quality and/or bad thermal stability. This can result in a higher than desired wet etch rates and film shrinkage of 40% or more after annealing at increased temperatures (e.g. around 400° C.).

A post-deposition treatment may be used to achieve a high-quality flowable SiCN/SiN film. However, as noted above, post-deposition treatment of wafers may lead to slower throughput. Furthermore, a single post-deposition treatment may provide limited reforming depth. For example, FIGS. 1C and 2C illustrate example flowable deposition gap-fills using a post-deposition anneal (i.e. thermal treatment). As illustrated in FIG. 1C and shown in the STEM image of FIG. 2C, a single post-deposition anneal not form a completely void-free, and seam-free gap-fill. A single thermal treatment may result in a shrinkage of the film, which may lead to void formation at the bottom of the film, as shown in FIGS. 1C and 2C.

Several other approaches have been previously proposed to improve film quality after a flowable deposition including a post-deposition plasma or ultraviolet (UV) treatments. However, there are limitations in the film quality obtained using plasma or UV based treatments. An in-situ cyclic plasma cure can be used to improve film quality. This eliminates film shrinkage and improves the wet etch rates to desired values. However, the downside is that filling capability is significantly reduced when utilizing an in-situ cyclic plasma cure. Without being limited by any particular theory, the reduction in filling capability may be caused by redeposition of outgassed species during the cyclic plasma treatment. Also, post-deposition treatments often lead to degradation of throughput. Thus, improved methods and apparatuses for flowable gap-fill processes are needed.

SUMMARY

For purposes of this summary, certain aspects, advantages, and novel features of the invention are described herein. It is to be understood that not all such advantages necessarily may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

In some embodiments, a method for flowable gap-fill deposition is provided. In some embodiments, the method may comprise: (a) placing a substrate in a first station; (b) depositing a flowable material on the substrate in the first station by a vapor deposition process at a first temperature, wherein the first temperature is less than 300° C.; (c) after depositing the flowable material on the substrate, placing the first substrate in the second station; (d) performing a thermal treatment on the substrate by heating a surface of the substrate to a second temperature in the second station, wherein the second temperature is between 80° C. and 1000° C.; and repeating (a)-(d) in a cycle until a film of desired thickness is deposited on the substrate.

In some embodiments, the flowable material is formed by a alkyl-silazane or aminosilane precursor. In some embodiments, the thermal treatment comprises a rapid thermal anneal (RTA). In some embodiments, the RTA comprises heating a surface of the substrate to the second temperature for less than 10 seconds. In some embodiments, the second temperature is between 800° C. and 1000° C.

In some embodiments, the first station comprises an upper chamber and a lower chamber, wherein the lower chamber comprises a shared intermediate space between the first station and a second station. In some embodiments, the first station and the second station comprise a shared pressure system such that the first station and the second station are maintained at a common pressure during the cycle. In some embodiments, the first station comprises a first station heating unit configured to control a temperature of the first station independently of a temperature of the second station, and wherein the second station comprises a second station heating unit configured to control the temperature of the second station independently of the temperature of the first station.

In some embodiments, the first temperature is lower than 300° C. In some embodiments, the film comprises a SiNH or SiCNH film. In some embodiments, the film fills at least 90% of a gap on the surface of the substrate, at least 95% of a gap on the surface of the substrate, at least 99% of a gap on the surface of the substrate, or at least 99.5% of a gap on the surface of the substrate. In some embodiments, the substrate comprises silicon or germanium.

In some embodiments, the method further comprises introducing one or more process gasses into first station during contacting the substrate in the first station, wherein the process gases comprise Ar, He, $N_2$, $H_2$, $NH_3$, $O_2$ or a combination of one or more of the above. In some embodiments, the precursor comprises alkyl-silazane or aminosilane, hexamethylcyclotrisilazane (HMCTS), or trisilylamine (TSA). In some embodiments, the common pressure during the cycle is between 300 Pa and 2800 Pa.

In some embodiments, wherein the cycle further comprises plasma curing the substrate after step (b) or (d), wherein the plasma curing comprises micro-pulsing radio frequency (RF) plasma into the first station or the second station. In some embodiments, the substrate is plasma cured in the second station after the substrate is annealed in the second station.

In some embodiments, a semiconductor processing apparatus is provided. In some embodiments, the apparatus comprises: one or more process chambers, each process chamber comprising two or more stations, each station comprising an upper compartment and a lower compartment, wherein the upper compartment is configured to contain a substrate during processing of the substrate, wherein the lower compartment comprises a shared intermediate space between the two or more stations; a first transfer system configured to move a substrate from a first process chamber to a second process chamber in a wafer handling chamber; a second transfer system configured to move the substrate from a first station to a second station within the shared intermediate space of a process chamber; a first heating unit configured to control a first station temperature independently of a second station temperature; a pressure system comprising a pump and exhaust, the pressure system configured to maintain a common process chamber pressure in the two or more stations; and a controller comprising a processor that provides instructions to the apparatus to control a cycle of: (a) placing a substrate in a first station, (b) depositing a flowable material on the substrate in the first station by a vapor deposition process at a first temperature, wherein the first temperature is less than 300° C.; (c) after depositing the flowable material on the substrate, placing the first substrate in the second station; (d) performing a thermal treatment on the substrate by heating a surface of the substrate to a second temperature in the second station, wherein the second temperature is between 80° C. and 650° C.; and repeating (a)-(d) in a cycle until a film of desired thickness is deposited on the substrate. In some embodiments, the thermal treatment is performed for every 1 nm-5 nm of deposited film thickness or for every 5 nm to 50 nm of deposited film thickness.

Some embodiments herein relate to a method for flowable gap-fill deposition, the method comprising: (a) placing a substrate in a first station, the first station comprising an upper chamber and a lower chamber, wherein the lower chamber comprises a shared intermediate space between the first station, a second station, a third station, and a fourth station; (b) contacting the substrate in the first station with a precursor at a first temperature, wherein the contacting with the precursor forms a first flowable film layer within a gap of the first substrate; (c) after contacting the substrate in the first station with the precursor, placing the substrate in the second station; (d) performing a first anneal on the substrate by heating the substrate to a second temperature in the second station to densify the first flowable film layer; (e) after performing the first anneal on the substrate, placing the substrate in the third station; (f) contacting the substrate in the third station with the precursor at the first temperature, wherein the contacting with the precursor forms a second flowable film layer within a gap of the first substrate; (g) after contacting the substrate in the third station with the precursor, placing the substrate in the fourth station; (h) performing a second anneal on the substrate by heating the substrate to the second temperature in the fourth station to densify the second flowable film layer; and repeating (a)-(h) in a cycle until a film of desired thickness is deposited on the first substrate, wherein the second temperature is different from the first temperature.

Some embodiments herein relate to a method for flowable gap-fill deposition, the method comprising: (a) placing a substrate in a station; (b) contacting the substrate in the first station with a precursor at a first temperature, wherein the contacting with the precursor forms a flowable film layer within a gap of the first substrate; (c) performing an anneal on the substrate by heating a surface of the substrate to a second temperature in the first station to densify the flowable film layer, wherein the second temperature is higher than the first temperature, and wherein the second temperature is between 80° C.-1000° C.; and repeating (a)-(c) in a cycle until a film of desired thickness is deposited on the first substrate, wherein the first temperature is lower than the second temperature. In some embodiments, the surface of the substrate is heated to the second temperature by one or more infrared lamps. In some embodiments, the surface of the substrate is heated to the second temperature for less than 10 seconds.

BRIEF DESCRIPTION OF THE DRAWINGS

The drawings are provided to illustrate example embodiments and are not intended to limit the scope of the disclosure. A better understanding of the systems and methods described herein will be appreciated upon reference to the following description in conjunction with the accompanying drawings, wherein.

DETAILED DESCRIPTION

Figure 1A:
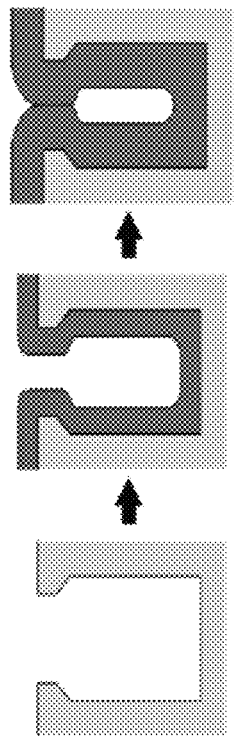
FIGS. 1A-1D illustrate a number of different types of gap-fill processes.
Figure 1B:
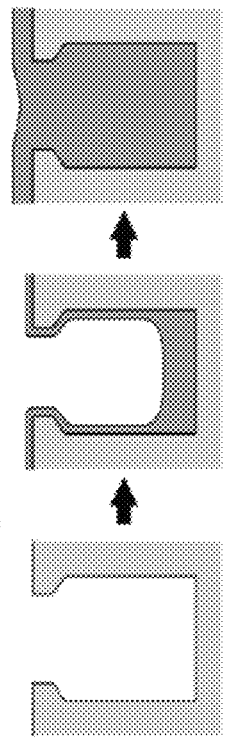

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present technology.

Introduction

In accordance with some embodiments herein, methods and apparatuses for flowable deposition of thin films are described. Methods and apparatuses described herein relate to filling gaps or other three-dimensional features on substrates, such as trenches, with a solid material by forming a flowable film in the gap. Some embodiments herein relate to a cyclic process including a deposition cycle comprising a flowable depostion and a thermal treatment. In some embodiments, the thermal treatment may comprise heating a substrate to an increased temperature relative to the deposition. In some embodiments, the thermal treatment may be performed in a separate chamber or station than the deposition. In other embodiments, the thermal treatment may be performed by heating a susceptor or substrate stage to a higher temperature than that used in the flowable deposition. In some embodiments, the thermal treatment may comprise a Rapid Thermal Anneal (RTA) with an infrared (IR) treatment. In some embodiments, the cycle may be carried out in a multi-process chamber comprising one or more stations connected by a shared intermediate space. As used herein, the term "substrate" can refer to any underlying material or materials that can be used to form, or upon which, a device, a circuit, or a film can be formed. A variety of substrates and deposition chemistries can be used in accordance with embodiments herein. A substrate can include a bulk material, such as silicon (e.g., single-crystal silicon), other Group IV materials, such as germanium, or other semiconductor materials, such as a Group II-VI or Group III-V semiconductor and can include one or more layers overlying or underlying the bulk material. The terms "wafer" and "substrate" are used interchangeably herein.

In some embodiments, a cyclic temperature treatment can be used as part of the gap-fill deposition process. In some embodiments, the cyclic temperature treatment may comprise performing gap-fill at low temperature followed by a cure at increased temperatures. In some embodiments, the cyclic gap-fill deposition process comprising a deposition cycle including the thermal treatment step may fill a gap without the formation of voids or seams, or may reduce the formation of voids or seams relative to a process that does not use the cyclic treatment. In some embodiments, the cyclic temperature treatment described herein may provide improved throughput relative to post-deposition treatment processes that require movement to different, seperate reaction chambers. In some embodiments, the treatment of the growing film with an increased temperature in each deposition cycle results in improved films, for example, with reduced formaton of seams or voids relative to other processes. In some embodiments, the heat treatment may improve cross-linking. In some embodiments, the cyclic temperature treatment may not comprise a plasma treatment. Without being limited by any specific theory, avoiding plasma treatment may prevent redeposition of outgassed species, leading to improved gap-fill. In some embodiments, multiple stations may be used, including stages set to different temperatures and a transfer system for transferring a wafer in between the stations. In some embodiments, different stations and different temperatures are used for the flowable deposition than for the thermal cure.

Some embodiments herein comprise using a multi-process chamber apparatus having one or more low-temperature deposition stations and one or more annealing stations. In some embodiments, a Multi-Process Quadruple-Chamber-Module (QCM) may be used, in which one or more low temperature deposition stations and one or more annealing stations are used. For example, some apparatuses may comprise two deposition stations and two annealing stations. In some embodiments, an a-CH, SiCN, SiN, SiON, SiCO, SiCOH, SiCNH, SiCH, SiNH or SiCON gap fill may be utilized. Thus, although the embodiments herein are primarily described in relation to SiN and/or SiCN deposition, the embodiments herein are broadly applicable to various process chemistries.

Figure 1C:
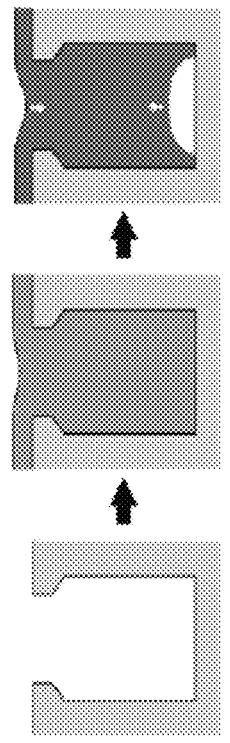
Figure 1D:
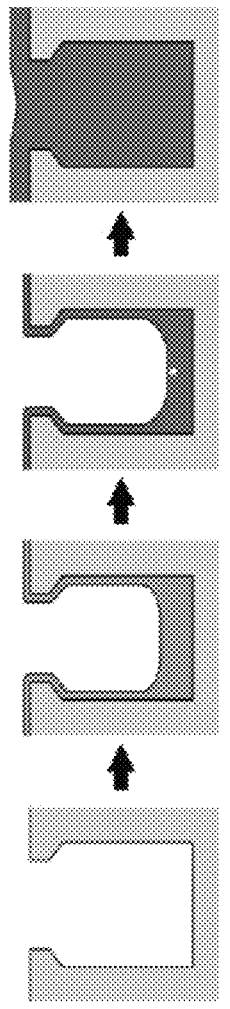
Figure 2A:
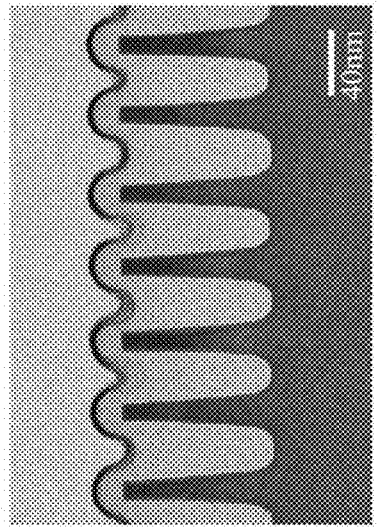
FIGS. 2A-2D illustrate Scanning Transmission Electron Microscopy (STEM) images of example flowable SiCN films using the various gap-fill processes exemplified in FIGS. 1A-1D.
Figure 2B:
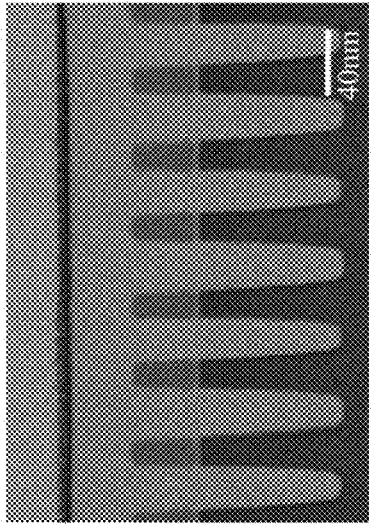
Figure 2C:
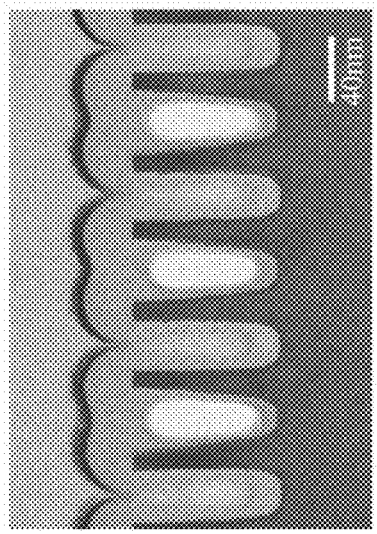
Figure 2D:
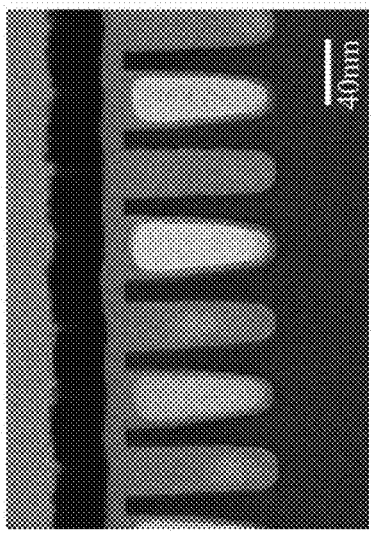

As noted above in relation to FIGS. 1C and 2C, a single post-deposition thermal treatment may be used to achieve a relatively high-quality flowable SiCN/SiN film. However, as noted above, post-deposition treatment of wafers may lead to undesirable degradation of throughput. Furthermore, a single post-deposition treatment may not be effective because of limited reforming depth. Thus, a cyclic deposition process including thermal treatment (e.g. annealing) in each cycle can provide improved gap fill as illustrated in FIGS. 1D and 2D. In some embodiments, cyclic annealing may be very effective to prevent the issue of film shrinkage. FIG. 1D illustrates an example flowable gap-fill using a cyclic anneal. FIG. 2D illustrates a STEM image of an SiCN flowable gap-fill using a cyclic anneal. As illustrated in FIGS. 1D and 2D, a flowable gap-fill using a cyclic process comprising one or more cycles including a thermal treatment phase may produce a void-free, seam-free, and high-quality film. In some embodiments, the cyclic process may be performed in a conventional reaction chamber apparatus. In some embodiments, the cyclic process may be performed in a QCM apparatus, as discussed herein.

Figure 3A:
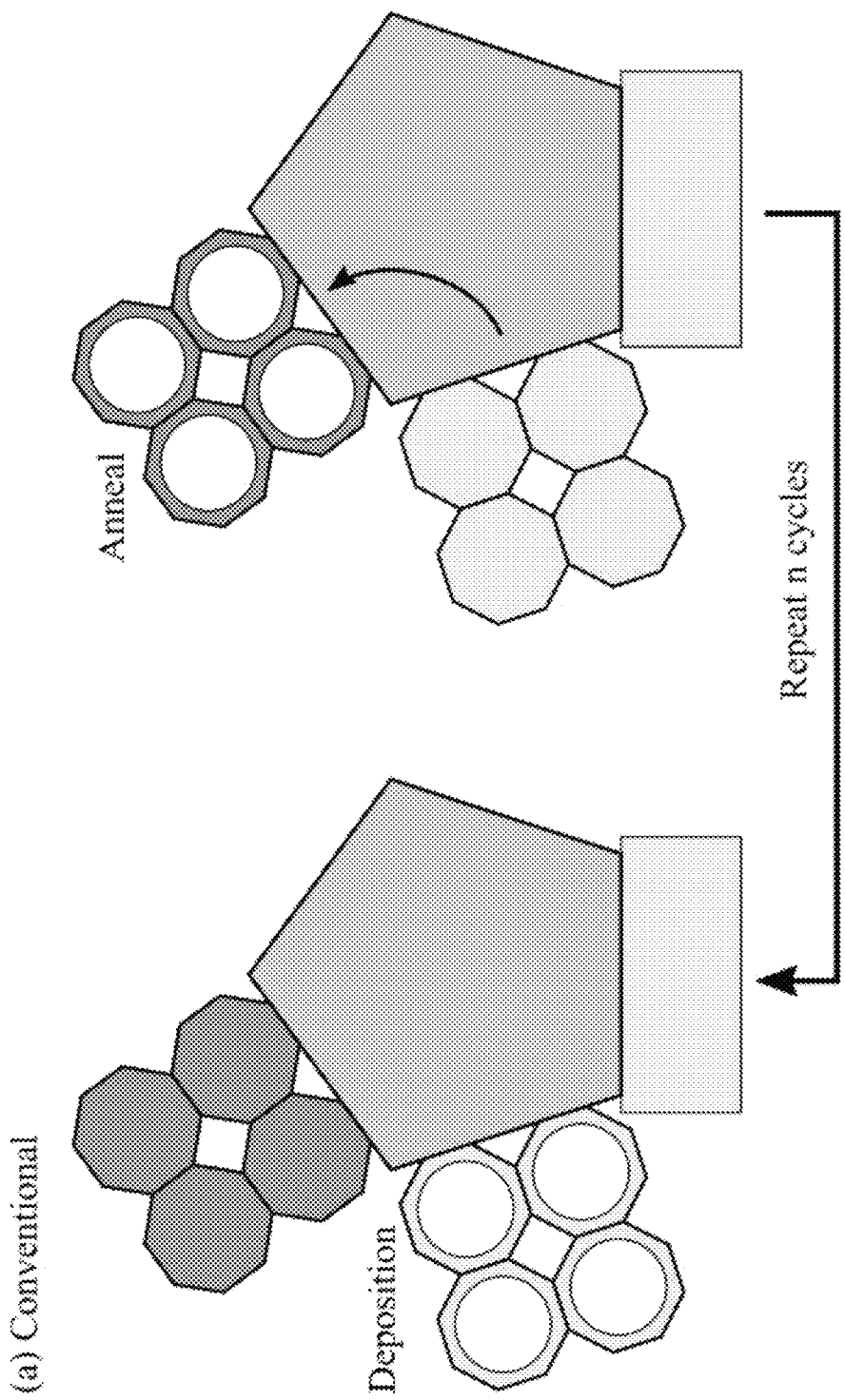
FIG. 3A illustrates a conventional apparatus for performing a deposition and subsequent anneal.

FIG. 3A illustrates a conventional apparatus for performing a deposition and subsequent anneal. As illustrated, a conventional apparatus may comprise one or more deposition chambers comprising one or more stations for performing deposition processes. The one or more deposition chambers may be separated from one or more anneal chambers via a wafer handling chamber or other transfer chamber. In the case of a typical cyclic treatment using multiple chambers, wafer transfer time between a deposition chamber and an anneal chamber through the transfer chamber can become even longer than processing times. To solve this issue, in some embodiments, a multi-process chamber module in which different processes are performed in a single chamber using separate stations can be used, and wafer transfer time may be reduced dramatically.

Thus, multi-process apparatuses having, for example, one or more low-temperature deposition stations and one or more high-temperature annealing stations are described herein. The thermal treatment provided by the annealing stations may improve flowable film quality of, for example, SiCN/SiN films. As noted above, plasma or UV treatments are limited in the uniform quality improvement in the film depth direction. By using a thermal process, film reformation and uniformity may be greatly enhanced.

Figure 3B:
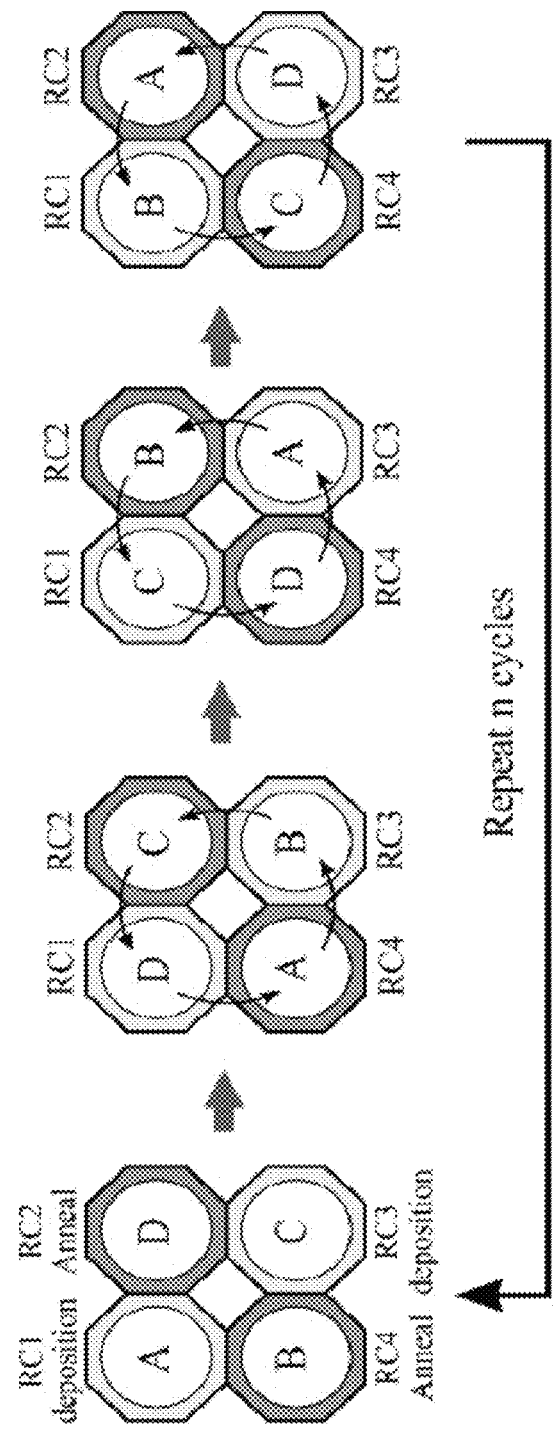
FIG. 3B illustrates a multi-process chamber module according to some embodiments described herein.

FIG. 3B illustrates a multi-process chamber module according to some embodiments described herein. In some embodiments, the multi-process chamber module may comprise a quad-station arrangement comprising two low-temperature deposition stations, shown in FIG. 3B as RC1 and RC3. The remaining two stations may comprise high-temperature annealing stations, shown in FIG. 3B as RC2 and RC4. In some embodiments, more stations may be present in a multi-process chamber module. Generally, these additional stations would include at least one additional deposition station an at least one additional treatment station. In some embodiments, the multi-process chamber module comprises at least two stations—one depositon station and one thermal treatment station.

As used herein, "station" refers broadly to a location that can contain a substrate so that a process may be performed on the substrate in the station. A station can thus refer to a reactor, or a portion or a reactor, or a reaction space or reaction chamber within a reactor. In some embodiments, stations in accordance with embodiments herein are in "gas isolation" from each other or are configured to be in gas isolation while a substrate is processed inside the station. In some embodiments, the stations are in gas isolation by way of physical barriers but not gas bearings or gas curtains. In some embodiments, the stations are in gas isolation by way of physical barriers in conjunction with gas bearings and gas curtains. In some embodiments, after or concurrently with the placement of a substrate in a particular station, that substrate is placed in gas isolation from the other stations (so that process steps can be performed in that station), and after the substrate has processed in the station, the station is brought out of gas isolation, and the substrate can be removed from the station and positioned in an intermediate space. Substrates from multiple different stations can be placed in a shared intermediate space for movement from station to station. The stations can be placed in gas isolation, for example, by a physical barrier. In some embodiments, the stations are not placed in gas isolation. In some embodiments, one or more stations comprises a heating and/or cooling system, so that different precursors in different stations can process substrates at different temperatures at the same time. As such, in some embodiments, an entire first station is at a lower or higher temperature than an entire second station, or a first station comprises a susceptor that is at a lower or higher temperature than a susceptor in a second station, and/or a first precursor is flowed into a first station while a second precursor is flowed into a second station at a lower or higher temperature than the first station.

In some embodiments, the stations are separated from each other by solid materials, and are not separated from each other by gas bearings or gas curtains. In some embodiments, the stations are separated from each other by solid materials or gas curtains and are not separated from each other by gas bearings. In some embodiments, the stations are separated from each other by solid materials or gas bearings and are not separated from each other by gas curtains. Optionally, the physical barrier can move in conjunction with a moving stage that shuttles substrates between the stations and the intermediate space, so that the physical barrier places the station in gas isolation at the same time (or slightly before or slightly after) the substrate is placed in that station. Optionally the physical barrier can be used in conjunction with a gas barrier, for example to fill some gaps left by the physical barrier. In some embodiments, a physical barrier is provided, but a gas barrier or gas curtain does not.

In some embodiments, a station comprises a module or chamber of a reactor, so that each station comprises a separate chamber or module. In some embodiments, a station comprises a portion of a reaction chamber which can be placed in gas isolation from other portions of the reaction chamber by positioning a wall, a gas curtain or a gas bearing between the stations. Optionally, a given station is completely enclosed by one or more walls, gas curtains, gas bearings, or a combination of any of these items. However, in some embodiments, the stations are not separated.

As illustrated in FIG. 3B, during a gap-fill process according to some embodiments herein, wafers may be rotated through the stations. For example, a wafer may enter the chamber at station RC1, at which the wafer may undergo a first flowable deposition process. In some embodiments, after undergoing the first flowable deposition process, the wafer may be transferred to RC4, as shown in FIG. 3B. Alternatively, the wafer may be transferred to RC2. In either case, the wafer may undergo a first anneal process. After the first anneal, the wafer may be transferred to RC3, where it may undergo a second flowable deposition process. After undergoing the second flowable deposition process, the wafer may be transferred to RC2 if it was previously transferred to RC4 or may be transferred to RC4 if it was previously transferred to RC2. In either case, the wafer may undergo a second anneal process. The wafer may be transferred back to RC1 to compete a single deposition-anneal cycle. The cycle may be repeated to achieve desired film quality. Furthermore, the wafer may enter the chamber at any one of RC1, RC2, RC3, or RC4 and cycle through the stations in any direction. Generally, however, the deposition-anneal cycle will begin with at least one flowable deposition process followed by at least one anneal process. The at least one flowable deposition process may be performed simultaneously on different wafers and/or performed sequentially on a single wafer. In the illustrated embodiment of FIG. 3B, deposition stations and annealing stations of the same type are positioned diagonally. In some embodiments, this configuration may improve film uniformity. However, neighboring placement of stations of the same type is also within the scope of the embodiments disclosed herein. In some embodiments, two or more pairs of stations perform the same process on two or more substrates in parallel.

Figure 3C:
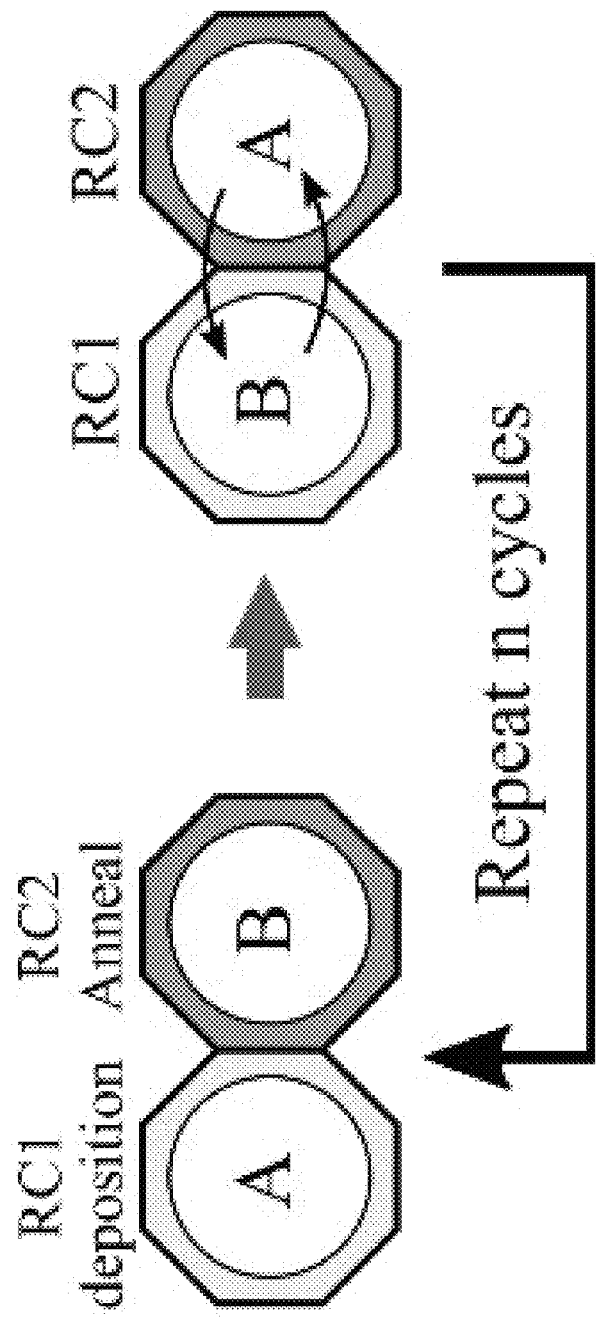
FIG. 3C illustrates a multi-process dual chamber module according to some embodiments described herein.

The above concept is also applicable for any different number of stations. By way of example, FIG. 3C illustrates a multi-process dual chamber module according to some embodiments described herein. In this system, a low-temperature flowable deposition and high-temperature anneal may be performed simultaneously and cyclically repeated by sequentially transferring wafers between RC1 and RC2.

Thus, in some embodiments, a multi-process chamber module as described herein may comprise multiple stations, half of which may be used for flowable deposition and the other half which may be used for thermal annealing. In some embodiments, a multi-process chamber module comprises at least 2 stations, for example at least 2, 3, 4, 5, 6, 7, 8, 9, 10, 11, 12, 13, 14, 15, 16, 17, 18, 19, 20, 30, 40, 50, 100, 150, 200, 250, 300, 400, or 500 stations, including ranges between any two of the listed values. However, the number of stations is not necessarily limited.

Multi-Process Chamber Module

In accordance with some embodiments herein, a multi-process chamber module herein may comprise two or more stations for performing a flowable deposition and anneal of a substrate. Optionally, the multi-process chamber module may also be configured to perform a plasma cure. In some embodiments, the multi-process chamber module may comprise a dual system gas-delivery and temperature control system, such that each station can be independently heated and different gases can be delivered to each station simultaneously. In some embodiments, each station of the multi-process chamber module may comprise a heater for heating the station independently from other stations of the multi-process chamber module. In some embodiments, the heater may comprise an aluminum nitride (AlN) ceramic heater or an anodized aluminum anodized heater. In some embodiments, the heater may comprise one or more heat lamps for transmitting IR radiation to a surface of the substrate.

In some embodiments, the multi-process chamber module may comprise an integrated, single system exhaust and pump system, such that all stations can be maintained at a synchronized pressure simultaneously. Furthermore, the multi-process chamber module may comprise a single system radio frequency power source for providing radio frequency power to the stations. In some embodiments, the multi-process chamber module may comprise a lower chamber comprising a transfer space and an upper chamber comprising the process stations. In some embodiments, the lower chamber and the upper chamber may be unsealed. However, in some embodiments, the chambers may be sealed from each other.

Some embodiments herein provide a station for deposition that is in gas communication with a precursor source, so that a precursor can be flowed into the station. An apparatus in accordance with some embodiments herein comprises a first station and a second station. The apparatus can further comprise a controller set to control the movement of the substrate from station to station, the flow of precursors and process gases into stations, and/or the purging of stations. Different process gases can be contacted with a substrate at different temperatures that are appropriate for each particular precursor. In some embodiments, a precursor in a station is delivered via a showerhead. Optionally, the showerhead comprises a heated showerhead so as to provide the precursor to the station at a desired temperature or range of temperatures. In some embodiments, the heated showerhead provides the process gas to the station at or near the temperature at which the precursor contacts the substrate. Optionally, the showerhead comprises a vacuum exhaust scavenger around its perimeter to capture excess precursor, and to minimize the amount of precursor that is potentially available to participate in CVD reactions with other gases. In some embodiments, precursors are contained within stations (and/or precursor source lines and/or purge lines) but are not permitted to enter any spaces between the stations.

In accordance with some embodiments herein, a substrate is shuffled between two or more stations, in which each station performs a deposition or anneal process. For example, a first station can provide a precursor that is adsorbed onto an exposed surface of the substrate at a first temperature, and a second station can perform a thermal treatment of the substrate at a second temperature different from the first temperature. The substrate can be repeatedly shuffled back and forth between the first and second stations until a void-less, seam-less gap-fill is formed. In some embodiments, the substrate moves continuously between stations. In some embodiments, the motion of the substrate between stations is not continuous, but rather comprises an indexing motion, such as a stop-start, or alternating slow-fast motions.

In some embodiments, the substrate is moved from one station to the next station in the process sequence (e.g. movement time between the first station and the second station, and not necessarily including time in the station) in less than 1000 milliseconds (msec), for example less than 1000 msec, 900 msec, 800 msec, 700 msec, 600 msec, 500 msec, 400 msec, 300 msec, 200 msec, 175 msec, 150 msec, 125 msec, 100 msec, 75 msec, 50 msec, 25 msec, 10 msec, or 5 msec, including ranges between any two of the listed values, for example 10-1000 msec, 10-500 msec, 10-400 msec, 10-300 msec, 10-200 msec, 10-100 msec, 30-1000 msec, 30-500 msec, 30-400 msec, 30-300 msec, 30-200 msec, 30-100 msec, 50-1000 msec, 50-500 msec, 50-400 msec, 50-300 msec, 50-200 msec, 50-100 msec, 100-1000 msec, 100-500 msec, 100-400 msec, 100-300 msec or 100-200 msec. Optionally, the substrate can be shuffled between two or more stations that are separated by solid materials such as walls, rather than gas bearings or gas curtains. Optionally, the substrate is shuffled between stations along a circular path or arc rather than a linear path. Optionally, the substrate is shuffled between stations along a linear path rather than an arc or circular path. It is also contemplated that moving a substrate from station-to-station without passing through any additional locations in accordance with some embodiments herein can increase throughput by minimizing handling time. Optionally, the substrate is moved directly from a first station to a second station without passing through an additional location.

It is noted that if two different stations comprise two different processes, different station conditions, for example different temperatures can be maintained in the different stations. For example, a first station can be at a first temperature optimized for a first process at the first station, and a second station can be at a second temperature optimized for a second process at the second station. As such, in some embodiments, the whole first station is at a different temperature than the whole second station. In some embodiments, the whole first station is at a different temperature than the whole second station, but the two stations are at the same pressure.

Optionally, a station is further in gas communication with a purge gas source and/or a vacuum, so that the station can be purged. For example, in accordance with some embodiments herein, after a substrate is contacted with a precursor at a first station (but before the substrate is moved to a second station), the station can be purged while the substrate remains in the first station so as to minimize or eliminate the possibility of an lingering precursor being transported to the second station along with the wafer.

Optionally, one or more stations in accordance with some embodiments herein comprise a susceptor on which a substrate can be placed. The susceptor can be heated or cooled, and thus can be configured to heat or cool a substrate to a suitable temperature. As such, in some embodiments, a susceptor in the first station is heated or cooled to a first temperature, while a susceptor in the second station is heated or cooled to a second temperature. Furthermore, in some embodiments, the susceptor can heat or cool the substrate for different durations so as to allow the substrate to reach the appropriate temperature. In some embodiments, cooling and/or heating susceptors may be necessary to maintain the large temperature differences between deposition stations and anneal stations. Optionally, the susceptor can have a lower mass than the substrate, so that the susceptor can be heated or cooled more rapidly than the substrate. In other embodiments, the susceptor may have a larger mass than the substrate, such that the substrate can be heated or cooled faster than the susceptor. Optionally, the susceptor does not move from station to station. Optionally, the susceptor comprises a heated and/or cooled susceptor. In some embodiments, the susceptor is at an appropriate temperature for deposition of a precursor before the substrate is placed on the susceptor. In some embodiments, the susceptor is heated to an appropriate temperature for deposition of a precursor after the substrate is placed on the susceptor.

A deposition station according to the embodiments herein may comprise a gas injection system fluidly coupled to a reaction space, a first gas source for introducing a precursor and optionally a carrier gas (e.g. He) into the reaction space, a second gas source for introducing a mixture of one or more process gasses into reaction space, an exhaust, and a controller, wherein the controller is configured to control gas flow into the gas injection system to carry out the methods as described herein. The controller(s) are communicated with the various power sources, heating systems, pumps, robotics, and gas flow controllers or valves of the reactor, as will be appreciated by the skilled artisan. In some embodiments, the gas injection system comprises a precursor delivery system that employs a carrier gas for carrying the precursor to the reaction space. In some embodiments, the controller may comprise a processor that provides instructions to the apparatus to control a cycle of: (a) placing a substrate in a first station; (b) contacting the substrate in the first station with a precursor at a first temperature, wherein the contacting with the precursor forms a flowable film layer within a gap of the first substrate; (c) after contacting the substrate in the first station with the precursor, placing the substrate in the second station; (d) performing an anneal on the substrate by heating the first substrate to a second temperature in the second station to densify the first flowable film layer. In some embodiments (a)-(d) are repeated in a cycle until a film of desired thickness is deposited on the substrate.

The apparatus can further comprise a substrate transfer system configured to place a substrate in a first station, and subsequently place the substrate in a second station after performing a first process (e.g. flowable deposition or anneal) on the substrate in the first station. The apparatus can comprise an intermediate space or wafer transfer space. The substrate transfer system can comprise a substrate transfer member such as a spider configured to move the substrate within the intermediate space. In some embodiments, moveable barriers defining a station are moved, exposing the substrate to the intermediate space, and the transfer member transfers the substrate through the intermediate space to a different station, which may then be placed in gas isolation via moveable barriers. In some embodiments, the substrate transfer system of the apparatus comprises one or more substrate transfer mechanisms (e.g. moveable stages), in which each substrate transfer mechanism is associated with only one station and can shuttle a substrate between its station and the intermediate space. As such, a transfer mechanism for each station can move the substrate from a particular station to the intermediate space, or from the intermediate space to the station. For example, a moveable stage can raise and lower the substrate between the intermediate space, and the station associated with that particular moveable stage. In some embodiments, the substrate transfer mechanism, or stage or susceptor in the station that is configured to receive the substrate comprises a plurality of lift pins. When the lift pins are extended, a substrate sitting on the extended lift pins can be readily accessible to the substrate transfer member (e.g. spider) for pick-up or drop-off. When the lift pins are retracted, the substrate can be positioned on the appropriate surface (e.g. surface of the stage or susceptor). In the intermediate space, the substrate can be moved from one station to another, or from one substrate transfer mechanism (e.g. moveable stage) to another, for example via a rotational substrate transfer member such as a spider. Optionally, each substrate transfer mechanism (e.g. moveable stage) comprises a plurality of lift pins configured to extend and lift the substrate from the substrate transfer mechanism in the intermediate space. The lifted substrate can be readily picked up by a transfer member such as a spider to move the substrate to a different substrate transfer member in the intermediate space. Optionally, after placing a substrate in a station (e.g. on a susceptor or stage) or on a substrate transfer mechanism associated with a station, the substrate transfer member is retracted into the intermediate space.

As used herein a "substrate transfer member" or "transfer member" refers to a structure such as a rotary member or spider that can move a substrate from a first station (or from a transfer mechanism associated with the first station) to a second station (or to a transfer mechanism associated with the second station). In some embodiments, the transfer system comprises a transfer member comprising a spider. A "spider", as used herein, refers to a wafer transfer member having multiple arms, each arm configured for engaging with a wafer through a spider end effector. The spider can be disposed centrally relative to a number of stations.

Figure 4:
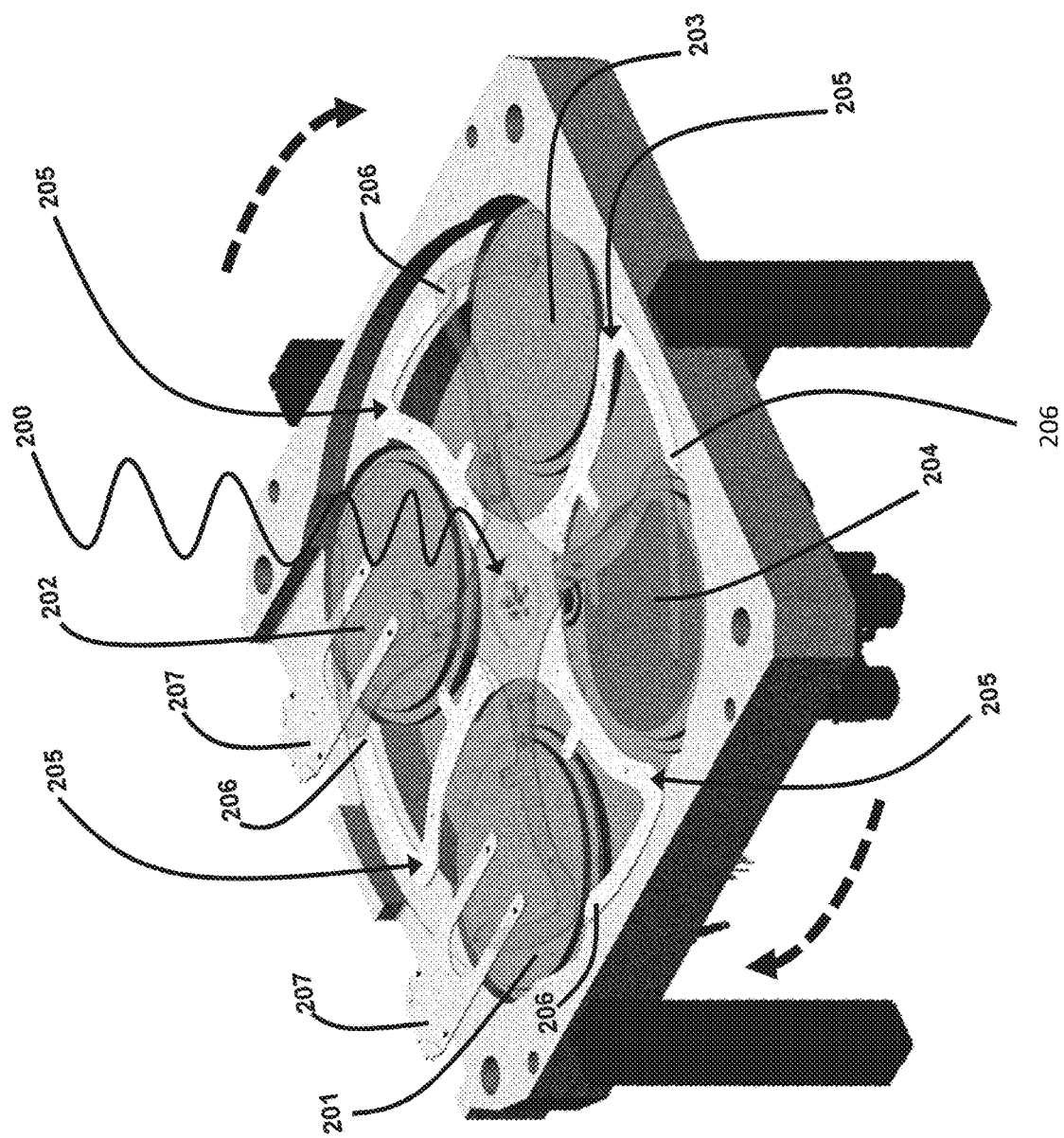
FIG. 4 illustrates a schematic drawing of a multi-process chamber module according some embodiments herein.

FIG. 4 illustrates a schematic drawing of a multi-process chamber module according some embodiments herein. In some embodiments, a multi-process chamber module may comprise a spider 200 centrally disposed relative to stations 201, 202, 203, 204. The spider 200 may have one or more arms 205, each arm provided with a spider end effector 206 for engaging a wafer. When the wafers needed to be transferred, the wafers may be elevated by lift pins or similar structures, and the spider 200 is rotated so that the spider end effectors 206 are underneath the wafer and the spider end effectors 206 engage with the wafers. In some embodiments, the spider 200 is rotated over 90 degrees (or a different value, if there is a different number of stations; for evenly distributed stations, the value can be 360 degrees divided by the number of stations), the spider end effector 206 disengages with the wafers, leaving the wafers seated on a surface (e.g. on a susceptor in a station, or on a substrate transfer mechanism as described herein), which can also comprise lift pins or similar structures for elevating the substrate. Then the spider 200 can be moved to an intermediate position, in between the stations 201, 202, 203, 204, so that when the stations are brought in gas isolation with each other, the spider nor any of its constituting parts are exposed to any of the reaction gases. Optionally, additional end effectors 207 can move the wafer out of the cluster of stations, and into a wafer handling chamber, load lock chamber, and/or another cluster of stations. In some embodiments, the wafers can be transferred in a clockwise or counterclockwise rotation between stations 201, 202, 203, 204, wherein stations 201, 202, 203, 204 comprise either flowable deposition stations or anneal stations.

In some embodiments, the substrate transfer system comprises a plurality of "substrate transfer mechanisms", in which each substrate transfer mechanism is associated with only one station, and can shuttle a substrate between a particular station and the intermediate space, for example by raising and lowering. Optionally, each substrate transfer mechanism (e.g. moveable stage) comprises a plurality of lift pins configured to extend and lift the substrate from the substrate transfer mechanism in the intermediate space. The lifted substrate can be readily picked up by a transfer member such as a spider to move the substrate to a different substrate transfer mechanism in the intermediate space. As such, each substrate transfer mechanism is exposed to no more than one station. In some embodiments, each substrate transfer mechanism comprises a moveable stage.

Figure 5:
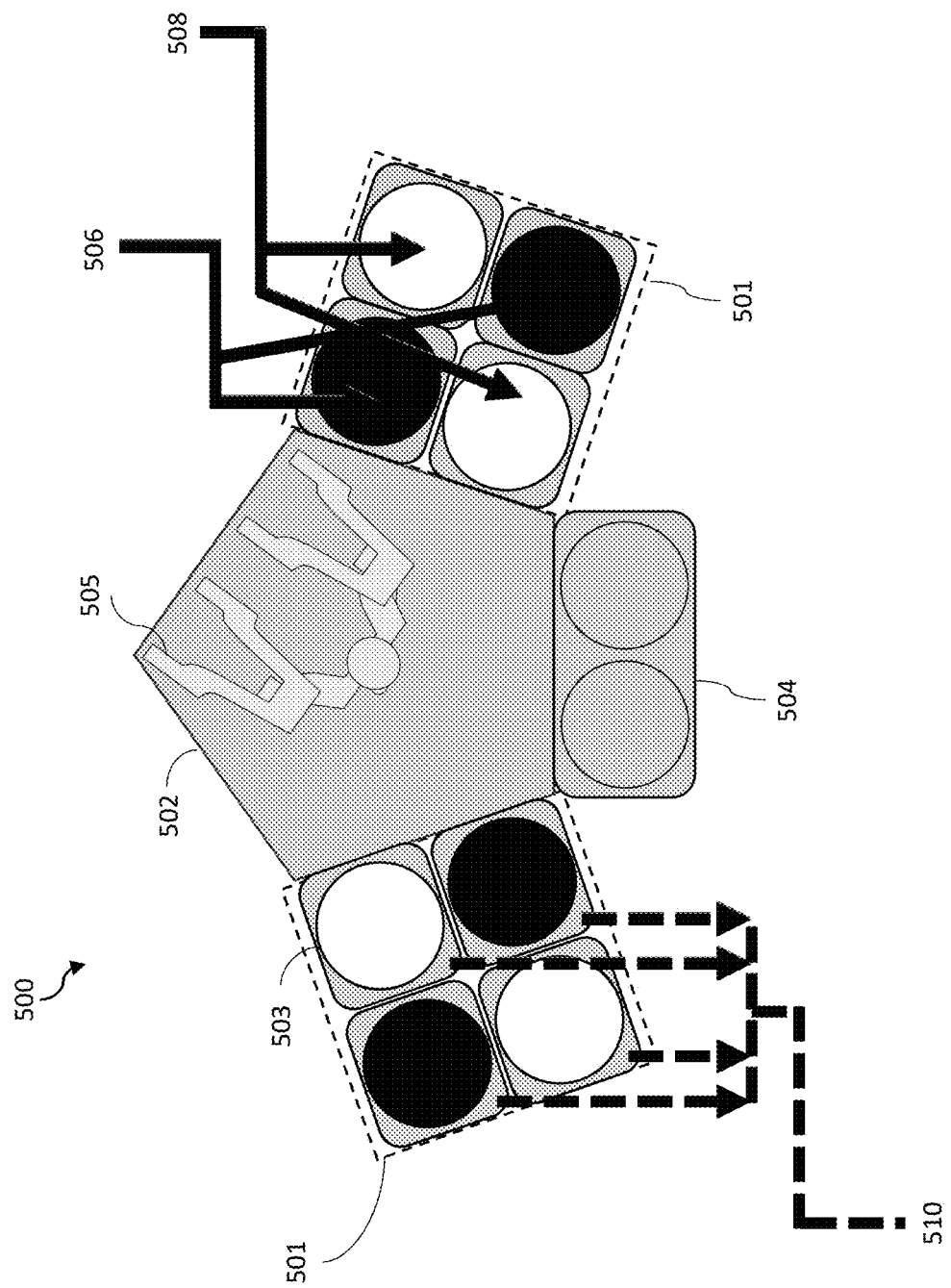
FIG. 5 illustrates a top-down diagram of a multi-process chamber module according some embodiments herein.

FIG. 5 illustrates a top-down diagram of a multi-process chamber module according some embodiments herein. Each multi-process chamber module 500 may comprise one or more process chambers 501, each process chamber comprising a one or more stations 503 in gas isolation from the other stations. In some embodiments, a spider 505 may move the substrate from process chamber-to-process chamber. An end effector stationed in a wafer handling chamber 502 (WHC) can add and remove substrates from the spider (in communication with the process chambers) and/or a load lock chamber 504 (LLC). As noted above, the multi-process chamber module may comprise a dual heating system comprising independent heating systems 506, 508. In some embodiments, heating system 506 may heat and/or cool one or more of the stations 503 independently from heating system 508 to a first temperature. Similarly, heating system 508 may heat and/or cool one or more of the other stations 503 independently from heating system 506 to a second temperature, different from the first temperature. This configuration enables different simultaneous processes in different stations, such as one or more deposition processes and one or more anneal processes. The multi-process chamber module 500 may also comprise a pressure system 510 comprising an exhaust and pump system. In some embodiments, the pressure system may be connected to all stations 503 in a reaction chamber 501, such that a same chamber pressure can be maintained in all of the stations 503 in the reaction chamber 501. In some embodiments, the stations 503 are not sealed from each other, such that each process space (i.e. upper chamber) is connected via an intermediate lower chamber space. In some embodiments, this lack of station separation allows for a less complex design, easier and faster wafer handling between stations, and a shared pressure system 510, such that deposition stations and anneal stations can be maintained at a same pressure simultaneously.

In some embodiments, a substrate processing equipment comprising one or more process module(s) (PM) are provided, in which a plurality of stations is located. The stations can comprise process spaces connected by an intermediate space (i.e. lower chamber). The substrate processing equipment can comprise at least two substrate transfer systems, one for moving substrates between the load lock chamber (LLC) and the PM, and the other for moving substrates between process stations in the PM. Optionally, the PM is equipped with a capability to run at least two different processes simultaneously in stations connected by an open intermediate space by independently controlling some process conditions such as gasses and temperature, but by sharing control of other process conditions such as pressure and RF.

In some embodiments, each station of the multi-process chamber module may comprise a heater for heating the station independently from other stations of the multi-process chamber module. In some embodiments, the heater may comprise an aluminum nitride (AlN) ceramic heater, an anodized aluminum anodized heater, and/or one or more IR heat lamps.

Figure 6A:
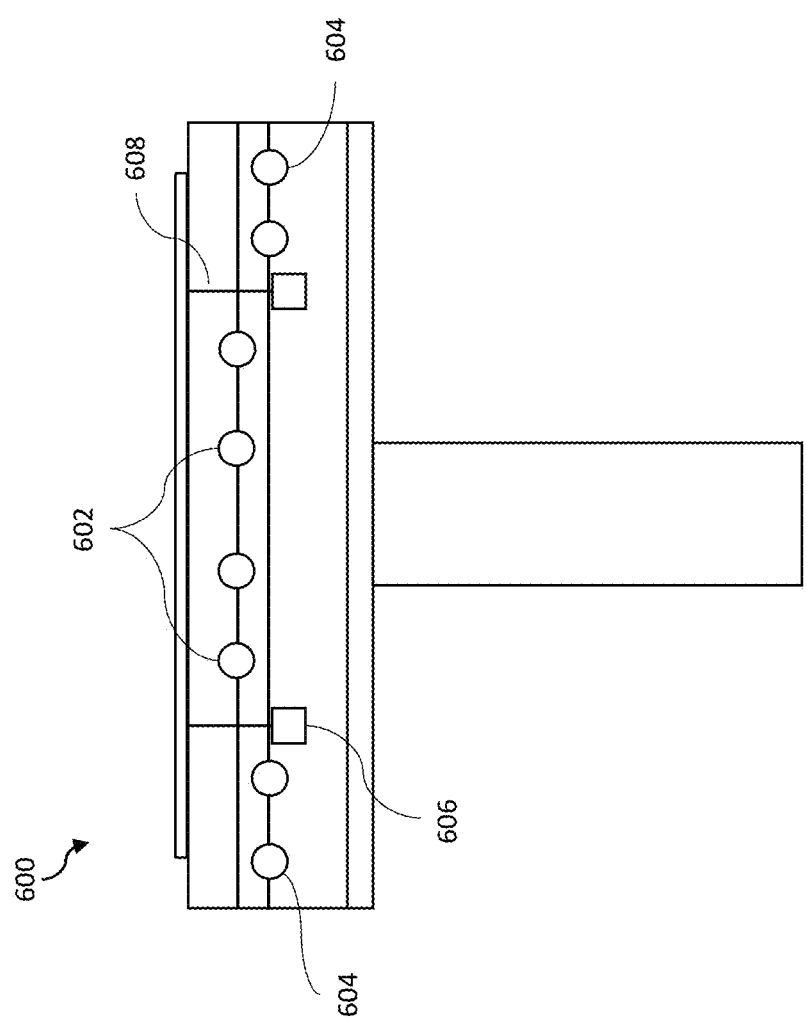
FIG. 6A illustrates an example diagram of a heating unit for use in a flowable deposition station according to some embodiments herein.

FIG. 6A illustrates an example diagram of a heating unit for use in a flowable deposition station according to some embodiments herein. The heating unit 600 may comprise one or more heating elements 602, 604, in a first and second heating zone, respectively. The heating elements may be located on a surface of or within the heating unit 600, which may be part of a susceptor for holding a substrate in a station of the multi-process chamber module. The heating elements may be powered to raise the temperature of the susceptor, substrate and/or station to a temperature suitable for flowable deposition. The heating unit 600 may also comprise a liquid cooling line 606 for cooling susceptor, substrate and/or station. A thermal isolation groove 608 may be provided to improve heating and/or cooling efficiency. For example, in some embodiments, the thermal isolation groove may separate the first and second heating zones to provide uniform heating to the wafer. In some embodiments, the heating unit may be configured to heat the susceptor, substrate and/or station to a temperature between about 20° C. and about 200° C. In some embodiments, the use of two heating zones effectively prevents unfavorable wafer temperature increases by plasma heat generation or wall temperature effects.

Figure 6B:
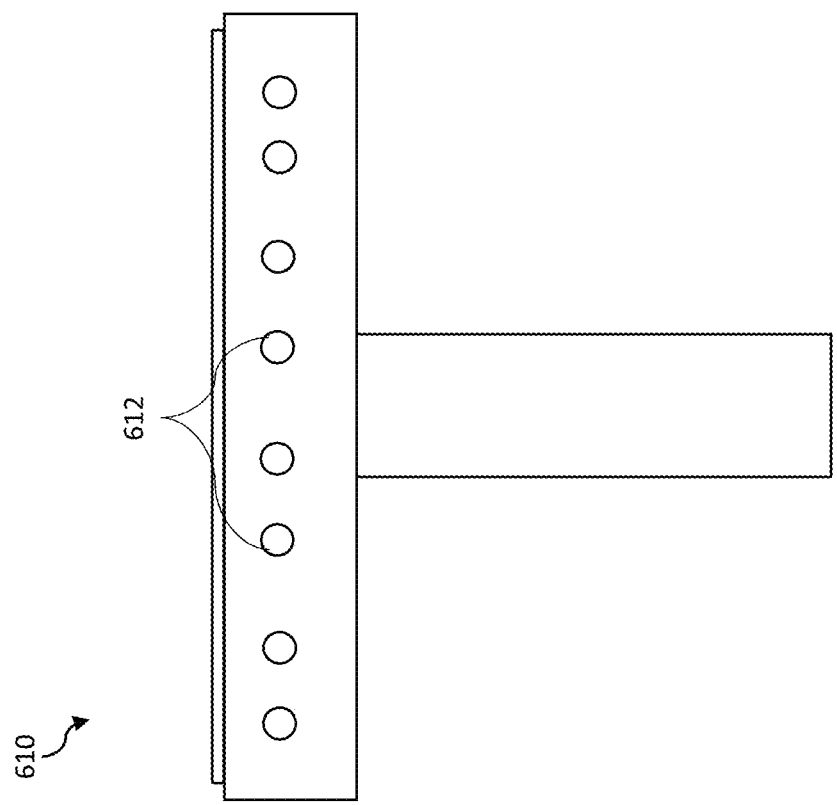
FIG. 6B illustrates an example diagram of a heating unit for use in an anneal station according to some embodiments herein.

FIG. 6B illustrates an example diagram of a heating unit for use in a anneal station according to some embodiments herein. The heating unit 610 may comprise one or more heating elements 612 in a single heating zone. In some embodiments, the heating unit may be configured to heat the susceptor, substrate and/or station to a temperature between about 400° C. and about 600° C.

Gap-Fill Methods

Various embodiments of the present disclosure relate to gap-fill methods, to structures and devices formed using such methods, and to apparatuses for performing the methods and/or for forming the structure and/or devices. Some embodiments relate to depositing flowable material in a deposition station and performing a thermal treatment in a second station. In some embodiments, a deposition process comprises introducing, in a deposition station, a substrate provided with a gap, the gap comprising a recess and a lateral space extending substantially latterly from the recess, introducing a precursor into the deposition station and introducing a plasma in the deposition station, whereby the precursor reacts to form a gap filling fluid that at least partially fills the recess and the lateral space of the gap. In some embodiments, the deposition may comprise introducing one or more process gases in addition to the precursor into the deposition station. In some embodiments, other vapor phase processes may be used to deposit a flowable material.

In some embodiments, the filling capability can be accomplished by forming a viscous material in a gas phase by striking, for example, a plasma, in a chamber filled with a volatile precursor that can be polymerized within certain parameter ranges. Optionally, the gas phase comprises a further gas apart from the plasma, for example a noble gas or $H_2$. Process parameters can include, for example, partial pressure of precursor during a plasma strike and wafer temperature. As used herein, polymerization can include formation of a longer molecule and need not necessarily include a carbon-carbon bond. Indeed, polymerization can include formation of for example Si—Si bonds, Si—C bonds, and/or Si—N bonds. In some embodiments, the viscous material forms a viscous phase and can flow in a trench on the substrate. Suitable substrates include silicon wafers. As a result, the viscous material seamlessly fills the trench in a bottom-up way. Example precursors within the scope of the embodiments herein include, for example, alkyl-silazane (Si, C, N, H-containing) or aminosilane/silylamine (Si, N, H-containing) precursors, including hexamethylcyclotrisilazane (HMCTS) for SiCN flowable deposition, as well as aminosilane and trisilylamine (TSA) for SiN deposition. In some embodiments, the precursor may be selected from the list consisting of silazanes, cyclosilazanes, and silicon alkylamines.

Flowable films may be temporarily obtained when the volatile precursor is polymerized by a plasma and deposited on a surface of a substrate, wherein gaseous precursor (e.g., monomer) is activated or fragmented by energy provided by plasma gas discharge so as to initiate polymerization, and when the resultant material is deposited on the surface of the substrate, the material shows temporarily flowable behavior. The film quality of the material deposited on the surface can be improved via a cyclic process including thermal treatment, as described herein.

In some embodiments, a volatile precursor is polymerized within a certain parameter range mainly defined by partial pressure of precursor during a plasma strike, wafer temperature, and total pressure in the reaction chamber. In order to adjust the "precursor partial pressure," an indirect process knob (dilution gas flow) may be used to control the precursor partial pressure. The absolute number of the precursor partial pressure may not be required in order to control flowability of deposited film, and instead, a ratio of flow rate of precursor to flow rate of the remaining gas and the total pressure in the reaction space at a reference temperature can be used as practical control parameters.

A gap in a substrate may refer to a patterned recess or trench in a substrate. Accordingly, exemplary methods of filling a patterned recess or trench on a substrate include providing a substrate comprising the recess/trench in a reaction space, providing a precursor to the reaction space, thereby filling the recess with the precursor, and providing a plasma to form a viscous phase of the precursor in the recess, wherein the viscous phase of the precursor flows and deposits or forms deposited material in the bottom portion of the recess relative to sidewalls and/or a top portion of the substrate away from the recess.

In some embodiments, gap-filling deposition methods include the use of a radio frequency (RF) plasma and pulsed precursor flow. In some embodiments, process parameters may be changed to achieve high enough partial pressure during the entire RF-on period for polymerization to progress, and to provide sufficient energy to activate the reaction (defined by the RF-on period and RF power). In some embodiments, temperature and pressure may be controlled for polymerization/chain growth and set above the melting point and below the boiling point of the flowable phase. In some embodiments, the process of filling a gap with a gap filling fluid comprises one or more of the following substeps. A substrate comprising the gap is positioned in a deposition station. The gap comprises a recess in fluid connection with one or more lateral spaces. In some embodiments, a precursor may be introduced into the deposition station. In some embodiments, one or more process gases may also be introduced into the deposition station. The process gasses may comprise the one or more further gases including a co-reactant. In some embodiments, a plasma, such as an RF plasma, may be maintained in the deposition station. In some embodiments, the precursor may be reacted to form a gap filling fluid on the substrate. In some embodiments, the gap filling fluid may at least partially fill the plurality of recesses and the one or more lateral spaces. In some embodiments, the process gases and the precursor may be introduced simultaneously. In some embodiments, the precursor may be introduced before or after the process gases. In some embodiments, the RF plasma may be maintained before, during, or after introduction of the precursor and/or process gases. It will be understood by those skilled in the art that when the methods described above are carried out in a sequential manner, i.e., cyclically, a small amount of material may be deposited each cycle and the sequence of steps may be repeated until a layer with a desired thickness is obtained. In some embodiments, the process is carried out cyclically and one or more steps are separated by purge gas pulses.

In some embodiments, the above methods involve providing the precursor intermittently to the deposition station, and continuously applying a plasma. In some embodiments, the above methods involve providing the precursor intermittently to the deposition station, and intermittently applying a plasma. The latter embodiments thus feature the sequential application of precursor pulses and plasma pulses to the reaction space.

In some embodiments, process gasses may comprise, for example, Ar, He, $N_2$, $H_2$, $NH_3$, $O_2$, or a combination of one or more of the above. In some embodiments, precursors may only be introduced into deposition stations. In other words, deposition stations and annealing stations may comprise separated precursor gas connections.

Without being bound by theory or any particular mode of operation, it is believed that the depositing material desirably remains viscous or liquid throughout the deposition process and should not readily solidify or evaporate. It is further believed that under desirable reaction conditions, the vapor pressure of the liquid phase, but not that of the precursor, should be lower than total station pressure. Thus, it is believed that station temperature and pressure should be maintained at conditions under which the flowable reaction products exist as a liquid, and the precursor exists as a gas.

In some embodiments, the station pressure may be maintained at a pressure between around 300 Pa to 2800 Pa. For example, the station pressure may be maintained at about 300 Pa, about 350 Pa, about 400 Pa, about 450 Pa, about 500 Pa, about 550 Pa, about 600 Pa, about 650 Pa, about 700 Pa, about 750 Pa, about 800 Pa, about 850 Pa, about 900 Pa, about 950 Pa, about 1000 Pa, about 1050 Pa, about 1100 Pa, about 1150 Pa, about 1200 Pa, about 1250 Pa, about 1300 Pa, about 1350 Pa, about 1400 Pa, about 1450 Pa, about 1500 Pa, about 1550 Pa, about 1600 Pa, about 1650 Pa, about 1700 Pa, about 1750 Pa, about 1800 Pa, about 1850 Pa, about 1900 Pa, about 1950 Pa, about 2000 Pa, about 2050 Pa, about 2100 Pa, about 2150 Pa, about 2200 Pa, about 2250 Pa, about 2300 Pa, about 2350 Pa, about 2400 Pa, about 2450 Pa, about 2500 Pa, about 2550 Pa, about 2600 Pa, about 2650 Pa, about 2700 Pa, about 2750 Pa, about 2800 Pa, or any value between any of the aforementioned values.

In some embodiments, the deposition station temperature may be maintained at a temperature lower than about 300° C. For example, the station temperature may be maintained via a heating/cooling system at about 50° C., about 55° C., about 60° C., about 65° C., about 70° C., about 75° C., about 80° C., about 85° C., about 90° C., about 95° C., about 100° C., about 105° C., about 110° C., about 115° C., about 120° C., about 125° C., about 130° C., about 135° C., about 140° C., about 145° C., about 150° C., about 155° C., about 160° C., about 165° C., about 170° C., about 175° C., about 180° C., about 185° C., about 190° C., about 195° C., about 200° C., about 205° C., about 210° C., about 215° C., about 220° C., about 225° C., about 230° C., about 235° C., about 240° C., about 245° C., about 250° C., about 255° C., about 260° C., about 265° C., about 270° C., about 275° C., about 280° C., about 285° C., about 290° C., about 295° C., about 300° C., or any value between the aforementioned values.

In some embodiments, RF power may be provided to the station is between about 20 W and 1000 W. For example, in some embodiments, RF power may be provided to the station at about 20 W, about 40 W, about 60 W, about 80 W, about 100 W, about 120 W, about 140 W, about 160 W, about 180 W, about 200 W, about 220 W, about 240 W, about 260 W, about 280 W, about 300 W, about 320 W, about 340 W, about 360 W, about 380 W, about 400 W, about 420 W, about 440 W, about 460 W, about 480 W, about 500 W, about 520 W, about 540 W, about 560 W, about 580 W, about 600 W, about 620 W, about 640 W, about 660 W, about 680 W, about 700 W, about 720 W, about 740 W, about 760 W, about 780 W, about 800 W, about 820 W, about 840 W, about 860 W, about 880 W, about 900 W, about 920 W, about 940 W, about 960 W, about 980 W, about 1000 W, or any value between the aforementioned values.

In some embodiments, a film having a thickness of at least about 1 nm is deposited per cycle, for example about 1 nm, about 2 nm, about 3 nm, about 4 nm, about 5 nm, about 6 nm, about 7 nm, about 8 nm, about 9 nm, about 10 nm, about 15 nm, about 20 nm, about 25 nm, about 30 nm, about 35 nm, about 40 nm, about 45 nm, about 50 nm, about 60 nm, about 70 nm, about 80 nm, about 90 nm, or about 100 nm, including ranges between any two of the listed values, for example 1 nm-100 nm, 1 nm-20 nm, 1 nm-10 nm, 1 nm-5 nm, 2 nm-100 nm, 2 nm-20 nm, 2 nm-10 nm, 2 nm-5 nm, 3-4 nm, 5 nm-100 nm, 5 nm-20 nm, 5 nm-10 nm, 10 nm-100 nm, or 10 nm-20 nm.

Precursors and process gases may be provided to the stations at a volumetric flow rate of around 0.1 standard liter per minute (SLM) to about 10 SLM. For example, precursors and process gases may be provided to the stations at a volumetric flow rate of about 0.1 SLM, about 0.5 SLM, about 1 SLM, about 1.5 SLM, about 2 SLM, about 2.5 SLM, about 3 SLM, about 3.5 SLM, about 4 SLM, about 4.5 SLM, about 5 SLM, about 5.5 SLM, about 6 SLM, about 6.5 SLM, about 7 SLM, about 7.5 SLM, about 8 SLM, about 8.5 SLM, about 9 SLM, about 9.5 SLM, about 10 SLM, about 10.5 SLM, about 11 SLM, about 11.5 SLM, about 12 SLM, about 12.5 SLM, about 13 SLM, about 13.5 SLM, about 14 SLM, about 14.5 SLM, about 15 SLM, about 15.5 SLM, about 16 SLM, about 16.5 SLM, about 17 SLM, about 17.5 SLM, about 18 SLM, about 18.5 SLM, about 19 SLM, about 19.5 SLM, about 20 SLM, or any value in between the aforementioned values.

In some embodiments, the substrate comprises a semiconductor. In some embodiments, the semiconductor comprises silicon. Further provided herein is a structure comprising a semiconductor substrate comprising a plurality of recesses. The plurality of recesses is in fluid connection with one or more lateral spaces. Also, the plurality of recesses and the one or more lateral spaces are at least partially filled with a gap filling fluid upon completion of one or more deposition cycles. In some embodiments, the gap filling fluid completely fills at least 90%, preferably at least 95%, more preferably at least 99%, most preferably all of the plurality of recesses. In some embodiments, the gap filling fluid completely fills at least 90%, preferably at least 95%, more preferably at least 99%, most preferably all of the lateral spaces. In other words, the gap filling fluid preferably fills the entirety of each lateral space that is to be filled with gap filling fluid. In some embodiments, the gap filling fluid is substantially free of voids or seams.

In some embodiments, after deposition and/or the thermal cyclic anneal, the substrate may undergo an $NF_3$ and $O_2$ cleaning process. In some embodiments, a plasma curing step may also be employed to further improve the gap-fill film quality. In some embodiments, the curing step may employ a continuous direct plasma. Gap filling fluid deposition and direct plasma curing may be carried out cyclically. In some embodiments, this allows efficiently curing all, or at least a large portion, of the gap filling fluid. In some embodiments, the curing step may involve the use of a micro-pulsed plasma. In some embodiments, the plasma curing step may be carried out cyclically, i.e., alternating cycles of gap filling fluid deposition and micro pulsed RF plasma are employed, though a post-deposition micro-plasma curing treatment is possible as well. The application of cyclic gap filling fluid deposition and plasma steps allows efficiently curing all, or at least a large portion, of the gap filling fluid.

In some embodiments, a cyclical gap-fill process may comprise performing a deposition step in a deposition station, performing a thermal anneal step in an anneal station, and optionally repeating the deposition step and the thermal step until a film of desired thickness and quality is formed on a substrate. The cycle of deposition-anneal may be performed n times, wherein n is an integer. In some embodiments, after completion of one instance of a flowable deposition step and optional curing step, a wafer may be transferred to a separate anneal station, where the wafer may undergo a thermal anneal step. The thermal treatment provided by the annealing stations may improve flowable film quality of, for example, SiCN/SiN films. In some embodiments, the cyclic anneal may comprise a heat treatment, including a thermal cure using He, Ar, $N_2$, $H_2$, or $O_2$, $NH_3$, $H_2O_2$, or any combination of the aforementioned, followed by a wafer cleaning process using $NF_3$ and $O_2$. During the cyclic anneal, the wafer may be heated to a temperature between about 80° C. and about 650° C. For example, the wafer may be heated to a temperature between about 80° C., about 90° C., about 100° C., about 110° C., about 120° C., about 130° C., about 140° C., about 150° C., about 160° C., about 170° C., about 180° C., about 190° C., about 200° C., about 210° C., about 220° C., about 230° C., about 240° C., about 250° C., about 260° C., about 270° C., about 280° C., about 290° C., 300° C., about 310° C., about 320° C., about 330° C., about 340° C., about 350° C., about 360° C., about 370° C., about 380° C., about 390° C., about 400° C., about 410° C., about 420° C., about 430° C., about 440° C., about 450° C., about 460° C., about 470° C., about 480° C., about 490° C., about 500° C., about 510° C., about 520° C., about 530° C., about 540° C., about 550° C., about 560° C., about 570° C., about 580° C., about 590° C., about 600° C., about 610° C., about 620° C., about 630° C., about 640° C., about 650° C., or any value between the aforementioned vales. Similar pressure and gas conditions as those in the deposition chamber can be used to perform deposition and annealing simultaneously.

Figure 7A:
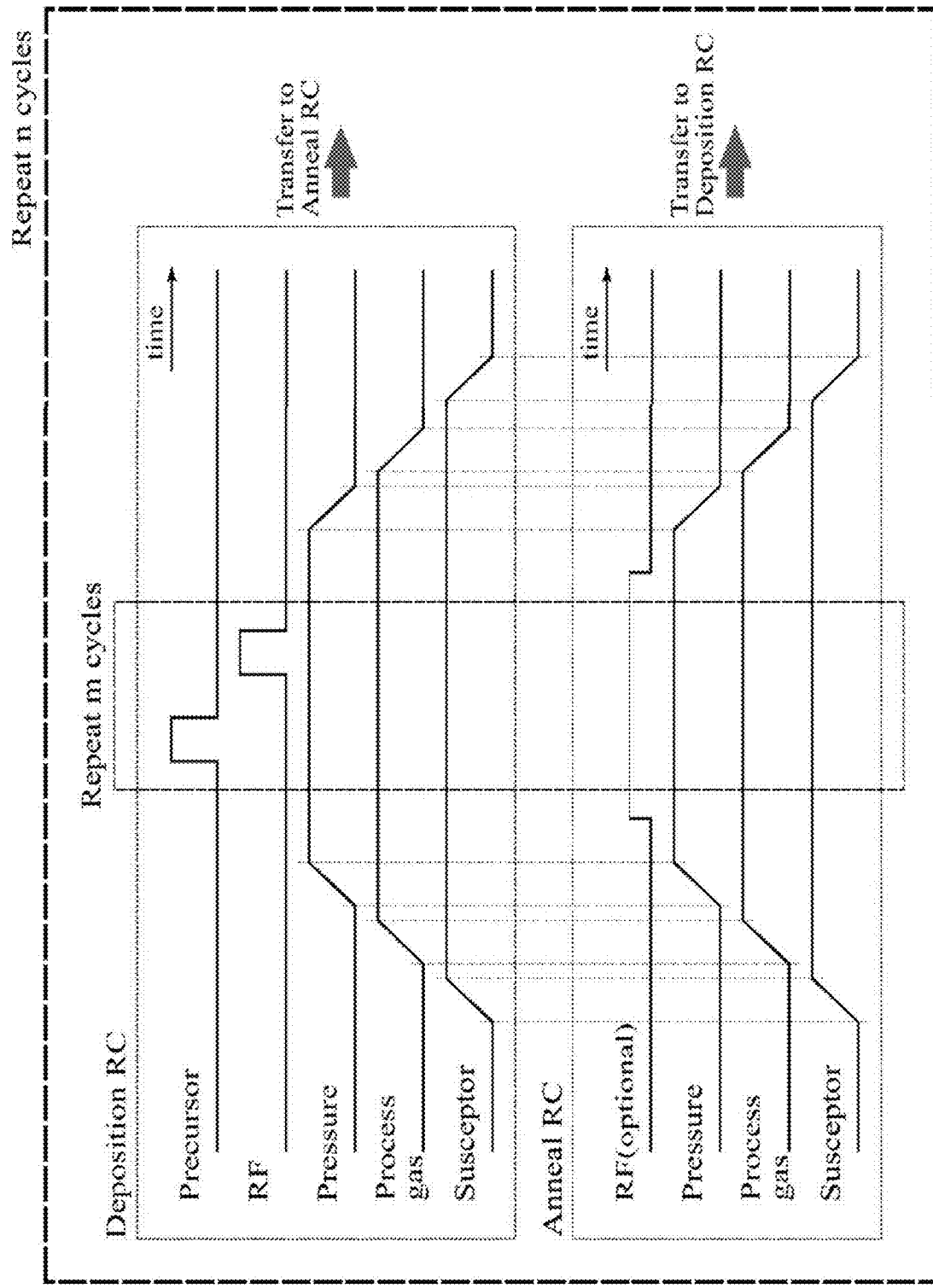
FIG. 7A illustrates an example gap-fill method using a repeated cycle of ALD and annealing according some embodiments herein.
Figure 7B:
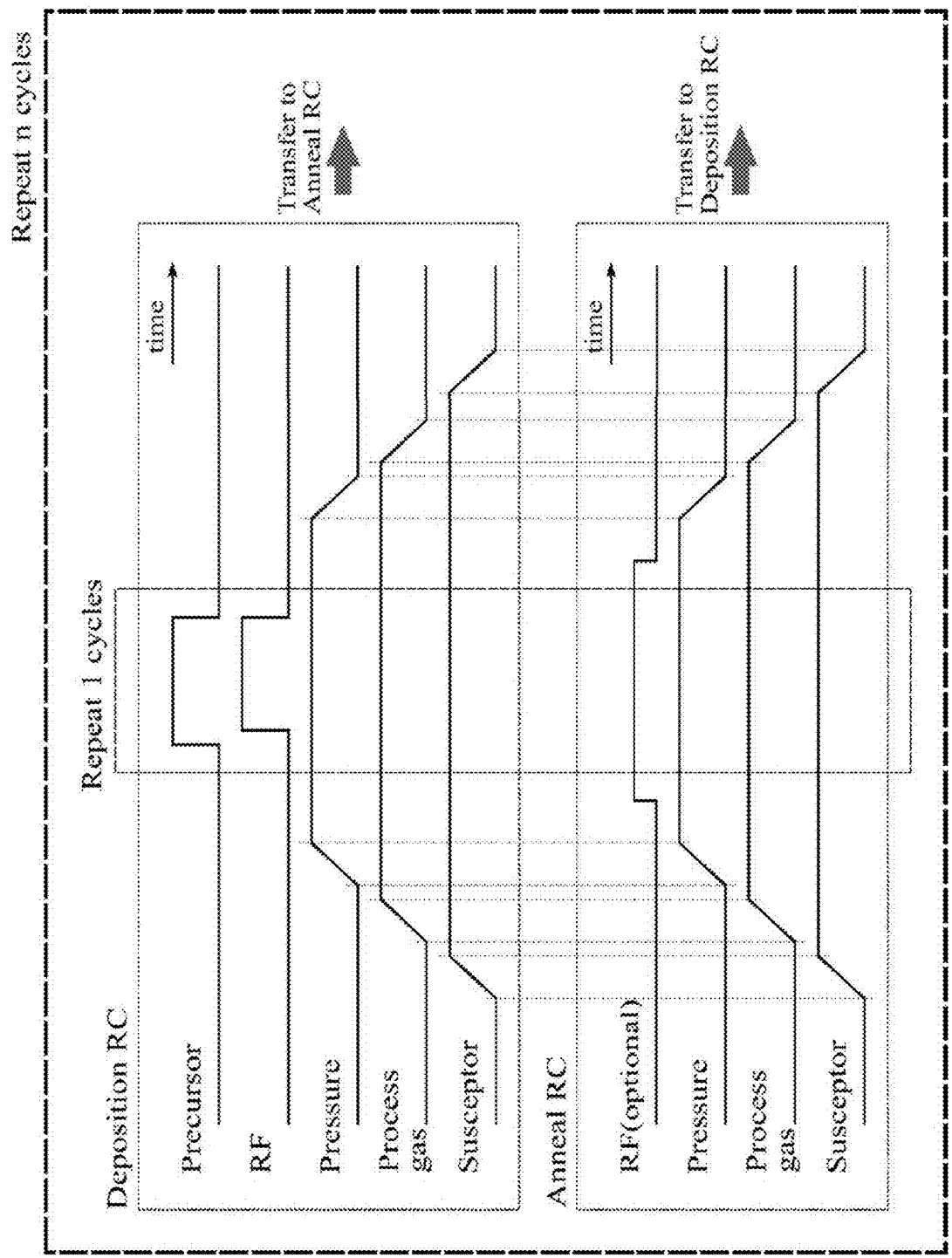
FIG. 7B illustrates an example gap-fill method using repeated cycle of CVD and annealing according some embodiments herein.
Figure 7C:
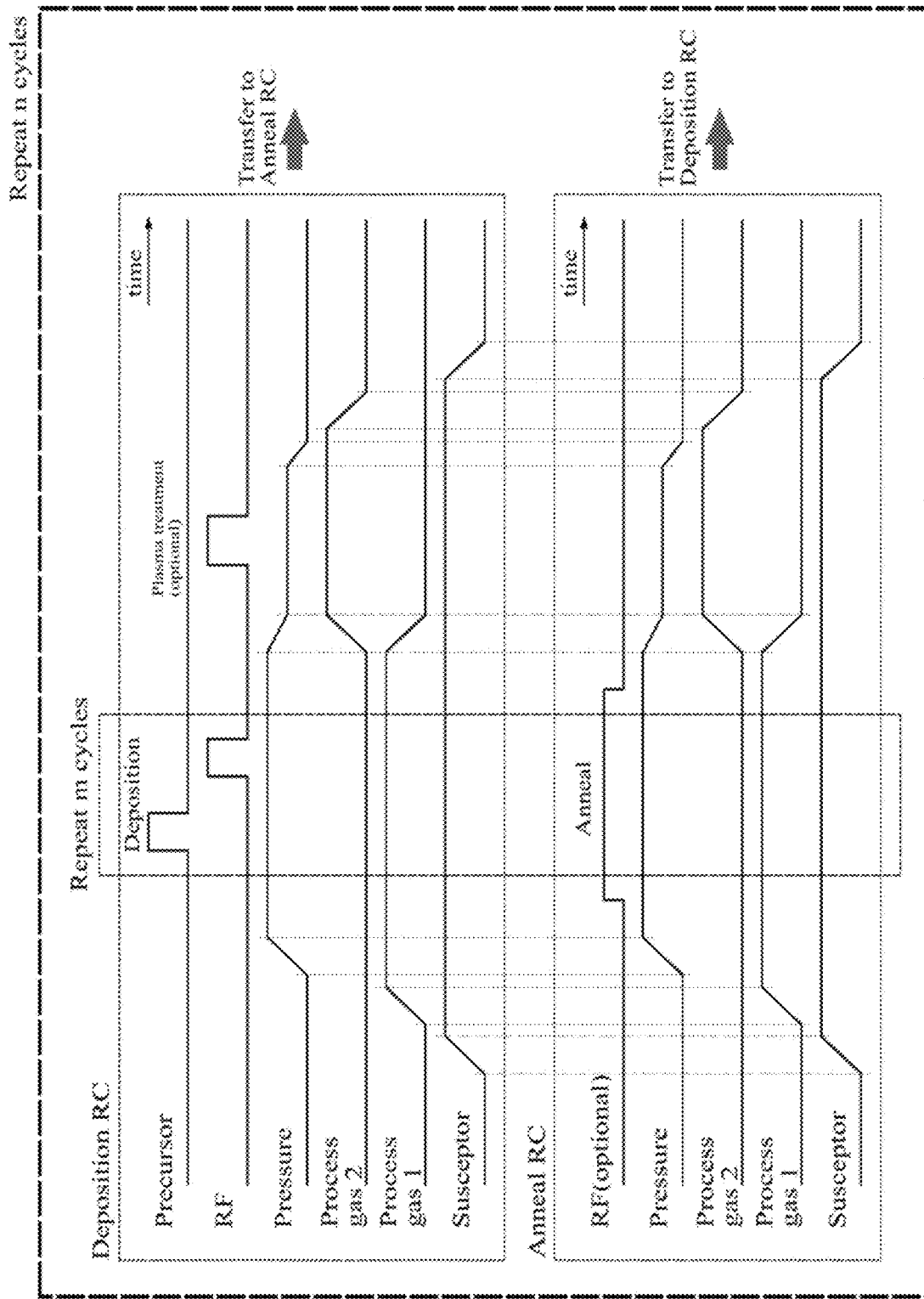
FIG. 7C illustrates an example gap-fill method using repeated cycle of ALD and annealing with a plasma cure according some embodiments herein.

FIGS. 7A-7C illustrate example embodiments of gap-fill methods using sequential application of precursor and plasma pulses. FIG. 7A illustrates an example gap-fill method using repeated cycle of vapor deposition, such as ALD, and annealing according some embodiments herein. The process may employ a precursor and one or more process gases including a co-reactant. The one or more process gases may be continuously provided to the reactor chamber at a constant flow rate. Precursor pulses and RF pulses may be applied sequentially in the deposition station. The deposition station may be maintained at a consistent pressure and temperature during the gap-fill deposition. After completion of the deposition process, the wafer may be transferred to an anneal station to undergo an anneal process. In some embodiments, one or more process gases is provided to the anneal station continuously while an anneal pressure and anneal temperature are maintained. In some embodiments, process gases used in an anneal station may comprise, for example, Ar, $O_2$, $H_2$, $N_2$, $NH_3$, He, $H_2O$, $H_2O_2$ and/or any combination of thereof. Optionally, RF power is provided to the anneal station continuously or pulsed during the duration of the anneal. The ALD deposition-anneal cycle may be repeated any number of times to achieve desired film quality. In some embodiments, the ALD process and the anneal process may be employed simultaneously, wherein the ALD process is performed on a first substrate while the anneal process may be performed on a second substrate. In a dual chamber module, such as that illustrated in FIG. 3C, the first substrate and the second substrate can be exchanged between RC1 and RC2 repeatedly until a desired film quality is achieved on both substrates.

FIG. 7B illustrates an example gap-fill method using a repeated cycle of a vapor deposition process, such as CVD, and annealing according some embodiments herein. In contrast to the ALD method, for CVD, the precursor and RF power may be applied concurrently. The anneal process may be substantially similar to the employed after the ALD process. The CVD deposition-anneal cycle may be repeated any number of times to achieve desired film quality. In some embodiments, the CVD process and the anneal process may be employed simultaneously, wherein the CVD process is performed on a first substrate while the anneal process may be performed on a second substrate. In some embodiments, the anneal treatment may be performed intermittently, such that the anneal is performed for every 1 nm-5 nm of deposited film thickness or for every 5 nm to 50 nm of deposited film thickness.

FIG. 7C illustrates an example gap-fill method using repeated cycle of ALD and annealing with a plasma cure according some embodiments herein. As with the ALD process of FIG. 7A, precursor pulses and RF pulses may be applied sequentially. However, after completion of the deposition process, a plasma cure treatment may be employed, as discussed herein. In some embodiments, the plasma cure may be employed in a deposition station. In other embodiments, the plasma cure may be employed in an anneal station. In some embodiments, the plasma cure may be performed after the anneal step or a rapid thermal anneal. For example, in some embodiments, the anneal or rapid thermal anneal may de-gas one or more gases from the flowable film, and the plasma cure may create additional bonds in the remaining film. In some embodiments, the plasma cure comprises continuously providing one or more process gases to the station and RF pulsing. In some embodiments, the station pressure may be reduced or increased relative to the pressure during deposition-anneal process during the plasma cure. Furthermore, the process gases flowed into the station during the deposition-anneal process may be different than the process gases flowed into the station during the plasma cure.

Rapid Thermal Anneal (RTA)

In some embodiments, the temperature difference between gap-fill stations in the multi-process chamber module described herein may be significant. For example, the flowable deposition stations may be maintained at less than 300° C. and the cyclic anneal stations may be maintained at about 450° C. In some embodiments, this may require complex hardware design. Additionally, in some embodiments, process times may be extended as the entire wafer must be heated and cooled for each treatment step.

In some embodiments, the use of a cyclic Rapid Thermal Anneal (RTA) may be used as an alternative to the use of the thermal treatment, as described above. In this case, the wafer is heated rapidly by exposure to infrared (IR) radiation, which may cure the gap-fill material improving its properties and quality. RTA exposure times can be in the range of about 0.1 sec to about 10 sec and allow for relatively higher temperatures to be used as only the top surface of the wafer is heated. For example, in some embodiments, the RTA exposure time may be about 0.1 sec, about 0.2 sec, about 0.3 sec, about 0.4 sec, about 0.5 sec, about 0.6 sec, about 0.7 sec, about 0.8 sec, about 0.9 sec, about 1 sec, about 1.1 sec, about 1.2 sec, about 1.3 sec, about 1.4 sec, about 1.5 sec, about 1.6 sec, about 1.7 sec, about 1.8 sec, about 1.9 sec, about 2 sec, about 2.1 sec, about 2.2 sec, about 2.3 sec, about 2.4 sec, about 2.5 sec, about 2.6 sec, about 2.7 sec, about 2.8 sec, about 2.9 sec, about 3 sec, about 3.1 sec, about 3.2 sec, about 3.3 sec, about 3.4 sec, about 3.5 sec, about 3.6 sec, about 3.7 sec, about 3.8 sec, about 3.9 sec, about 4 sec, about 4.1 sec, about 4.2 sec, about 4.3 sec, about 4.4 sec, about 4.5 sec, about 4.6 sec, about 4.7 sec, about 4.8 sec, about 4.9 sec, about 5 sec, about 5.1 sec, about 5.2 sec, about 5.3 sec, about 5.4 sec, about 5.5 sec, about 5.6 sec, about 5.7 sec, about 5.8 sec, about 5.9 sec, about 6 sec, about 6.1 sec, about 6.2 sec, about 6.3 sec, about 6.4 sec, about 6.5 sec, about 6.6 sec, about 6.7 sec, about 6.8 sec, about 6.9 sec, about 7 sec, about 7.1 sec, about 7.2 sec, about 7.3 sec, about 7.4 sec, about 7.5 sec, about 7.6 sec, about 7.7 sec, about 7.8 sec, about 7.9 sec, about 8 sec, about 8.1 sec, about 8.2 sec, about 8.3 sec, about 8.4 sec, about 8.5 sec, about 8.6 sec, about 8.7 sec, about 8.8 sec, about 8.9 sec, about 9 sec, about 9.1 sec, about 9.2 sec, about 9.3 sec, about 9.4 sec, about 9.5 sec, about 9.6 sec, about 9.7 sec, about 9.8 sec, about 9.9 sec, about 10 sec, or any value between any of the aforementioned values.

In some embodiments, the RTA may be performed at relatively higher temperatures than the thermal treatment/anneal discussed above. For example, in some embodiments, an RTA may performed at a temperature between about 80° C. to about 1000° C. In some embodiments, the RTA may be performed at about 80° C., about 105° C., about 130° C., about 155° C., about 180° C., about 205° C., about 230° C., about 255° C., about 280° C., 300° C., about 325° C., about 350° C., about 375° C., about 400° C., about 425° C., about 450° C., about 475° C., about 500° C., about 525° C., about 550° C., about 575° C., about 600° C., about 625° C., about 650° C., about 675° C., about 700° C., about 725° C., about 750° C., about 775° C., about 800° C., about 825° C., about 850° C., about 875° C., about 900° C., about 925° C., about 950° C., about 975° C., about 1000° C., or any value between the aforementioned values. In some embodiments, a higher temperature RTA may correspond to a lower exposure time.

As such, in some embodiments herein, a cyclic RTA may be utilized for curing flowable gap-fill. In some embodiments, a cyclic RTA may prevent redeposition, which is a problem in cyclic plasma treatments, while increasing throughput compared to a cyclic thermal treatment.

In some embodiments, in contrast to the multi-process chamber module apparatus and methods described above, during RTA, the substrate stage in the anneal station can be kept at the same temperature as the substrate stage in the deposition station, avoiding a temperature gap between treatments. As in the cyclic anneal, The RTA with IR-heating could be provided in a separate chamber to the flowable deposition, which requires wafer movement during each deposition-anneal cycle. However, in some embodiments, the RTA could be integrated in the deposition station itself to increase throughput. In some embodiments, using a single station may increase throughput and decrease the apparatus size. However, in some embodiments, when process gasses or desired process parameters (e.g. pressure) differ between the deposition station and thermal treatment, using a multi-station apparatus may be preferred.

In some embodiments, a deposition-RTA cycle may be repeated m number of times, wherein m is an integer. The value of m may depend on various process variables, including the growth rate of the flowable deposition process, on the volume of the gap structure to be filled, and whether the optional plasma cure is implemented. For example, in some embodiments, if a plasma cure is implemented, an RTA may be provided for every about 1 nm to about 5 nm of film growth. In some embodiments, if a plasma cure is not implemented, an RTA may be provided for every about 5 nm to about 50 nm of film growth.

As noted above, RTA substantially heats a top surface of wafer only. Thus, a temperature gap between stations is not required as it would be in multi-process chamber module conducting a flowable deposition and cyclic anneal. Furthermore, heating and cooling in RTA can be accelerated relative a cyclic anneal. The RTA approach avoids the redeposition effect observed in a cyclic plasma treatment and increases throughput compared to the cyclic thermal treatment.

Figure 8:
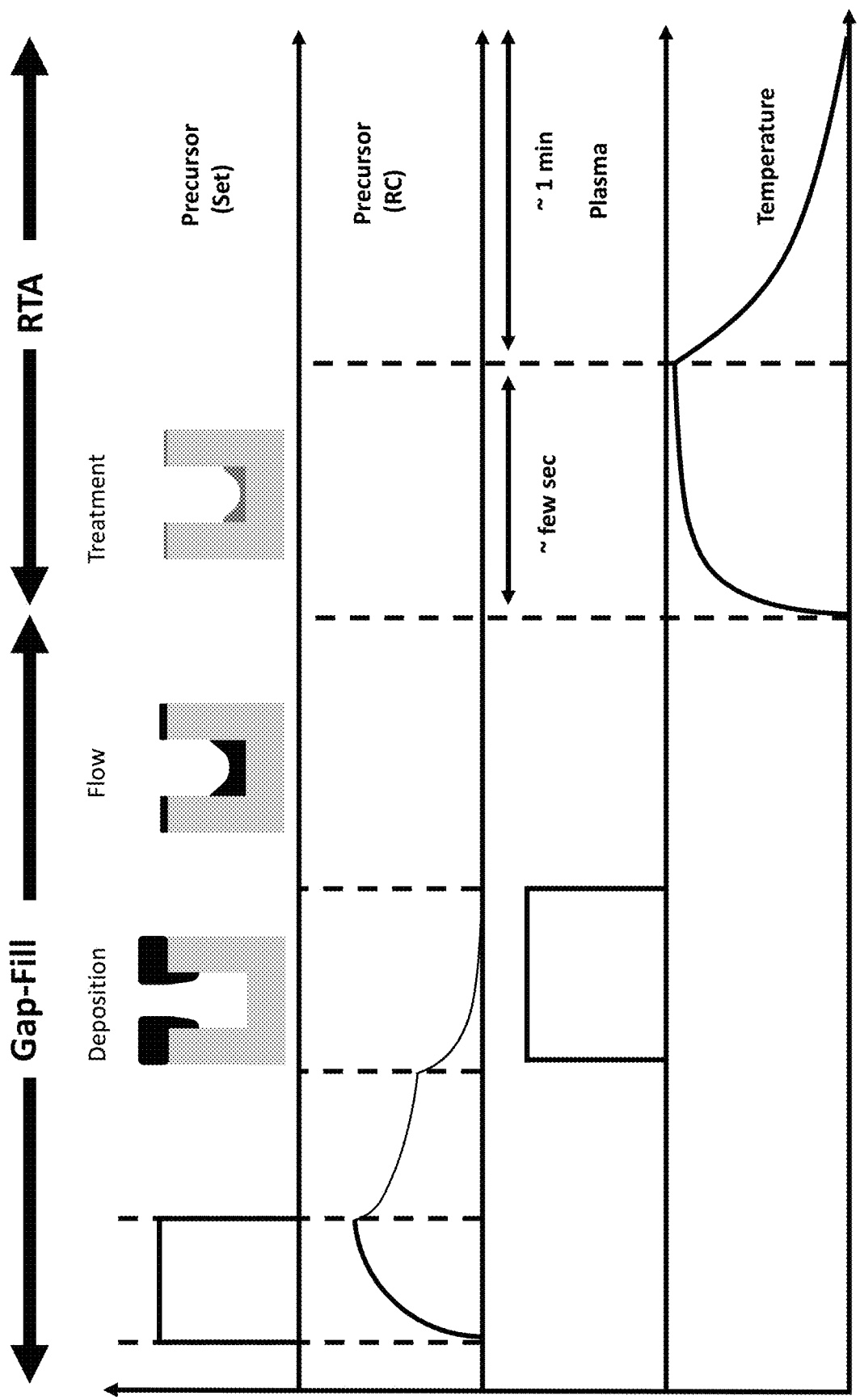
FIG. 8 illustrates an example gap-fill method using a Rapid Thermal Anneal (RTA) according to some embodiments herein.

FIG. 8 illustrates an example gap-fill method using a Rapid Thermal Anneal (RTA) according to some embodiments herein. As illustrated, a substrate may undergo a flowable deposition process comprising flowing one or more precursors and pulsing a plasma into a station holding the substrate. The one or more precursors may form a flowable film which may deposit unto a gap present on the substrate. After deposition, an RTA process may be undergone within the same station in which the flowable deposition process was completed, or within a separate station. The RTA may comprise raising the temperature of the top surface of the substrate over an exposure time of about 0.1 sec to 10 sec. In some embodiments, heat lamps, such as infrared lamps, may be used to heat the top surface of the substrate. The RTA may also comprise cooling the top surface of the substrate for about 1 min. The RTA may densify the deposited film while avoiding plasma re-deposition of outgassed species. The flowable deposition process and RTA may be repeated any number of times in a deposition-RTA cycle to form a film of desired thickness and quality.

Additional Embodiments

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while several variations of the embodiments of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the embodiments of the disclosed invention. Any methods disclosed herein need not be performed in the order recited. Thus, it is intended that the scope of the invention herein disclosed should not be limited by the particular embodiments described above.

It will be appreciated that the systems and methods of the disclosure each have several innovative aspects, no single one of which is solely responsible or required for the desirable attributes disclosed herein. The various features and processes described above may be used independently of one another or may be combined in various ways. All possible combinations and sub-combinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination. No single feature or group of features is necessary or indispensable to each and every embodiment.

It will also be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. In addition, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Further, while the methods and devices described herein may be susceptible to various modifications and alternative forms, specific examples thereof have been shown in the drawings and are herein described in detail. It should be understood, however, that the invention is not to be limited to the particular forms or methods disclosed, but, to the contrary, the invention is to cover all modifications, equivalents, and alternatives falling within the spirit and scope of the various implementations described and the appended claims. Further, the disclosure herein of any particular feature, aspect, method, property, characteristic, quality, attribute, element, or the like in connection with an implementation or embodiment can be used in all other implementations or embodiments set forth herein. Any methods disclosed herein need not be performed in the order recited. The methods disclosed herein may include certain actions taken by a practitioner; however, the methods can also include any third-party instruction of those actions, either expressly or by implication. The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (e.g., as much as reasonably possible under the circumstances). For example, "substantially constant" includes "constant." Unless stated otherwise, all measurements are at standard conditions including temperature and pressure.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present. The headings provided herein, if any, are for convenience only and do not necessarily affect the scope or meaning of the devices and methods disclosed herein.

Accordingly, the claims are not intended to be limited to the embodiments shown herein but are to be accorded the widest scope consistent with this disclosure, the principles and the novel features disclosed herein.

What is claimed is:

1. A method for flowable gap-fill deposition, the method comprising:
 (a) placing a substrate in a first station of a process chamber;

(b) depositing a flowable material on the substrate in the first station by a vapor deposition process at a first temperature, wherein the first temperature is less than 300° C.;

(c) after depositing the flowable material on the substrate, placing the first substrate in a second station of the process chamber;

(d) performing a thermal treatment on the substrate by heating a surface of the substrate to a second temperature in the second station, wherein the second temperature is between 80° C. and 1000° C.; and repeating (a)-(d) in a cycle until a film of desired thickness is deposited on the substrate, wherein the first station and the second station are not gas sealed from each other, and wherein the first station and the second station comprise a shared pressure system comprising a shared exhaust and a shared pump system, such that the first station and the second station are maintained at a common pressure during the cycle.

2. The method of claim 1, wherein the flowable material is formed by an alkyl-silazane or aminosilane precursor.

3. The method of claim 1, wherein the thermal treatment comprises a rapid thermal anneal (RTA).

4. The method of claim 3, wherein the RTA comprises heating a surface of the substrate to the second temperature for less than 10 seconds.

5. The method of claim 4, wherein the second temperature is between 800° C. and 1000° C.

6. The method of claim 1, wherein the first station comprises an upper chamber and a lower chamber, wherein the lower chamber comprises a shared intermediate space between the first station and a second station, such that a process space of the first station and a process space of the second station are connected via the shared intermediate space.

7. The method of claim 1, wherein the thermal treatment is performed for every 1 nm-5 nm of deposited film thickness.

8. The method of claim 7, wherein the common pressure during the cycle is between 300 Pa and 2800 Pa.

9. The method of claim 1, wherein the first station comprises a first station heating unit configured to control a temperature of the first station independently of a temperature of the second station, and wherein the second station comprises a second station heating unit configured to control the temperature of the second station independently of the temperature of the first station, wherein the temperature of the first station is different than the temperature of the second station.

10. The method of claim 1, wherein the film comprises a SINH or SiCNH film.

11. The method of claim 1, wherein the film fills at least 90% of a gap on the surface of the substrate.

12. The method of claim 1, wherein the substrate comprises silicon or germanium.

13. The method of claim 1, further comprising introducing one or more process gasses into first station during contacting the substrate in the first station, wherein the process gases comprise Ar, He, $N_2$, $H_2$, $NH_3$, $O_2$ or a combination of one or more of the above.

14. The method of claim 1, wherein the precursor comprises alkyl-silazane or aminosilane, hexamethylcyclotrisilazane (HMCTS), or trisilylamine (TSA).

15. The method of claim 1, wherein the cycle further comprises plasma curing the substrate after step (b) or (d), wherein the plasma curing comprises micro-pulsing radio frequency (RF) plasma into the first station or the second station.

16. The method of claim 15, wherein the substrate is plasma cured in the second station after the substrate is annealed in the second station.

17. A method for flowable gap-fill deposition, the method comprising:

(a) placing a substrate in a first station of a process chamber, the first station comprising an upper chamber and a lower chamber, wherein the lower chamber comprises a shared intermediate space between the first station, a second station, a third station, and a fourth station;

(b) while the first station and the second station are isolated from each other via a gas isolation, contacting the substrate in the first station with a precursor at a first temperature, wherein the contacting with the precursor forms a first flowable film layer within a gap of the first substrate;

(c) after contacting the substrate in the first station with the precursor, removing the gas isolation and placing the substrate in the second station of the process chamber;

(d) performing a first anneal on the substrate by heating the substrate to a second temperature in the second station to densify the first flowable film layer;

(e) after performing the first anneal on the substrate, placing the substrate in the third station;

(f) contacting the substrate in the third station with the precursor at the first temperature, wherein the contacting with the precursor forms a second flowable film layer within a gap of the first substrate;

(g) after contacting the substrate in the third station with the precursor, placing the substrate in the fourth station;

(h) performing a second anneal on the substrate by heating the substrate to the second temperature in the fourth station to densify the second flowable film layer; and repeating (a)-(h) in a cycle until a film of desired thickness is deposited on the first substrate, wherein the second temperature is different from the first temperature, and the first station and the second station are maintained at a common pressure during steps (b) and (d).

18. A method for flowable gap-fill deposition, the method comprising:

(a) placing a substrate in a first station;

(b) contacting the substrate in the first station with a precursor at a first temperature, wherein the contacting with the precursor forms a flowable film layer within a gap of the first substrate;

(c) performing a rapid thermal anneal on the substrate by heating a surface of the substrate to a second temperature in the first station to densify the flowable film layer, wherein the second temperature is higher than the first temperature, and wherein the second temperature is between 800° C.-1000° C.; and repeating (a)-(c) in a cycle until a film of desired thickness is deposited on the first substrate, wherein the first temperature is lower than the second temperature.

19. The method of claim 18, wherein the surface of the substrate is heated to the second temperature by one or more infrared lamps.

20. The method of claim 18, wherein the surface of the substrate is heated to the second temperature for less than 10 seconds.

\* \* \* \* \*